(12) United States Patent
Ikehata

(10) Patent No.: US 7,694,817 B2
(45) Date of Patent: Apr. 13, 2010

(54) CONTAINER FOR STORING SUBSTRATE HAVING VENTILATED LID AND FAN

(75) Inventor: Yoshiteru Ikehata, Yasu (JP)

(73) Assignee: Daifuku Co., Ltd., Osaka (JP)

( * ) Notice: Subject to any disclaimer, the term of this patent is extended or adjusted under 35 U.S.C. 154(b) by 244 days.

(21) Appl. No.: 11/900,657

(22) Filed: Sep. 12, 2007

(65) Prior Publication Data
US 2008/0067107 A1    Mar. 20, 2008

(30) Foreign Application Priority Data

Sep. 13, 2006  (JP)  ............................. 2006-248173
Aug. 2, 2007   (JP)  ............................. 2007-202090

(51) Int. Cl.
*B65D 85/38* (2006.01)
*B01D 46/00* (2006.01)

(52) U.S. Cl. ................. 206/454; 206/711; 55/385.1; 55/385.6; 454/187; 454/192

(58) Field of Classification Search ................. 206/454, 206/710, 711; 55/385.1, 385.2, 385.6, 418, 55/471; 454/187, 192; 95/2–3, 6–8, 10; 96/109, 111, 112, 117.5
See application file for complete search history.

(56) References Cited

U.S. PATENT DOCUMENTS

| | | | |
|---|---|---|---|
| 6,309,437 B1 * | 10/2001 | Jones ......................... | 55/385.1 |
| 6,364,922 B1 * | 4/2002 | Tanaka et al. ............... | 55/385.1 |
| 6,723,151 B2 * | 4/2004 | Tanaka et al. ............... | 55/385.1 |
| 6,732,877 B2 * | 5/2004 | Wu et al. .................... | 206/710 |
| 6,758,876 B2 * | 7/2004 | Suzuki et al. ............... | 55/385.6 |
| 6,767,379 B2 * | 7/2004 | Jones ......................... | 55/385.6 |
| 6,770,109 B2 * | 8/2004 | Tanaka et al. ............... | 55/385.6 |
| 7,335,244 B2 * | 2/2008 | Kisakibaru et al. .......... | 55/385.6 |
| 2005/0268580 A1 | 12/2005 | Kisakibaru et al. | |

FOREIGN PATENT DOCUMENTS

JP        2001-308169        11/2001

* cited by examiner

*Primary Examiner*—Bryon P Gehman
(74) *Attorney, Agent, or Firm*—The Webb Law Firm

(57) ABSTRACT

A container configured to hold a plurality of substrates lined up vertically with space therebetween, which includes a container main unit formed in a tube shape having a quadrangular cross section as a whole that includes a first opening provided on one end side and a second opening provided on the other end side of the container spaced apart in the horizontal direction from the first opening, the first opening serving as an entrance for loading and unloading the substrates, a fan filter unit that is provided in an area of the second opening and that causes movement of air from the second opening toward the first opening, and a lid configured to be attached in an area of the entrance of the container main unit, the lid having an open state and a closed state, and forming a ventilation opening that allows air to pass in the closed state.

12 Claims, 30 Drawing Sheets

FIG.17
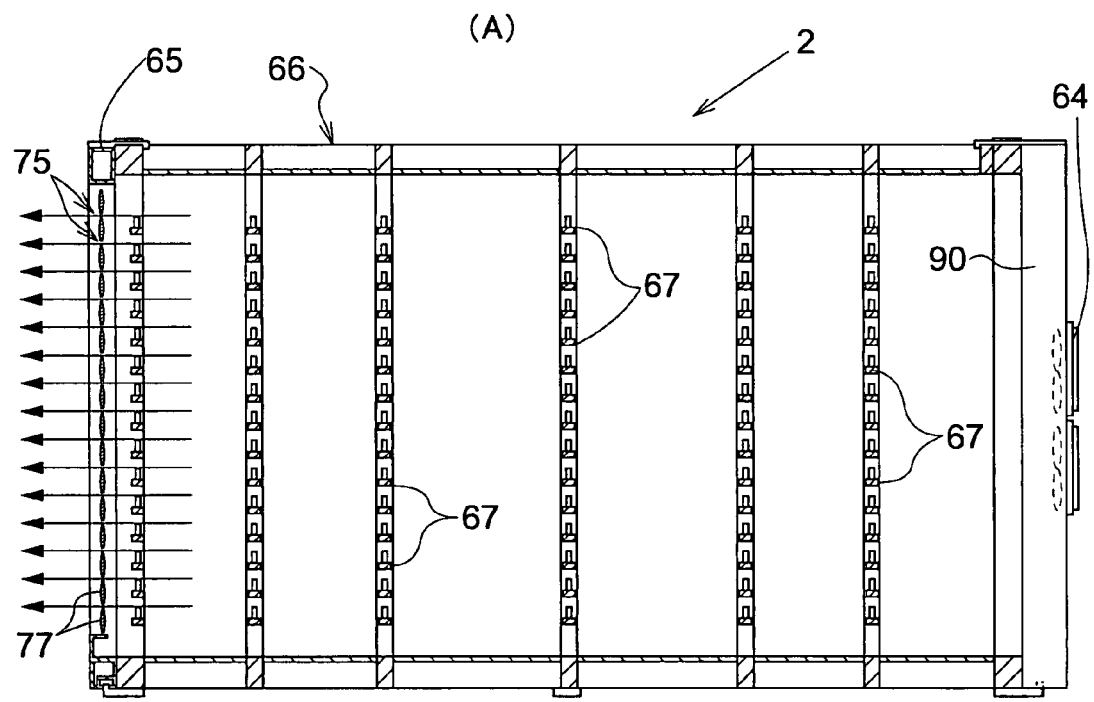
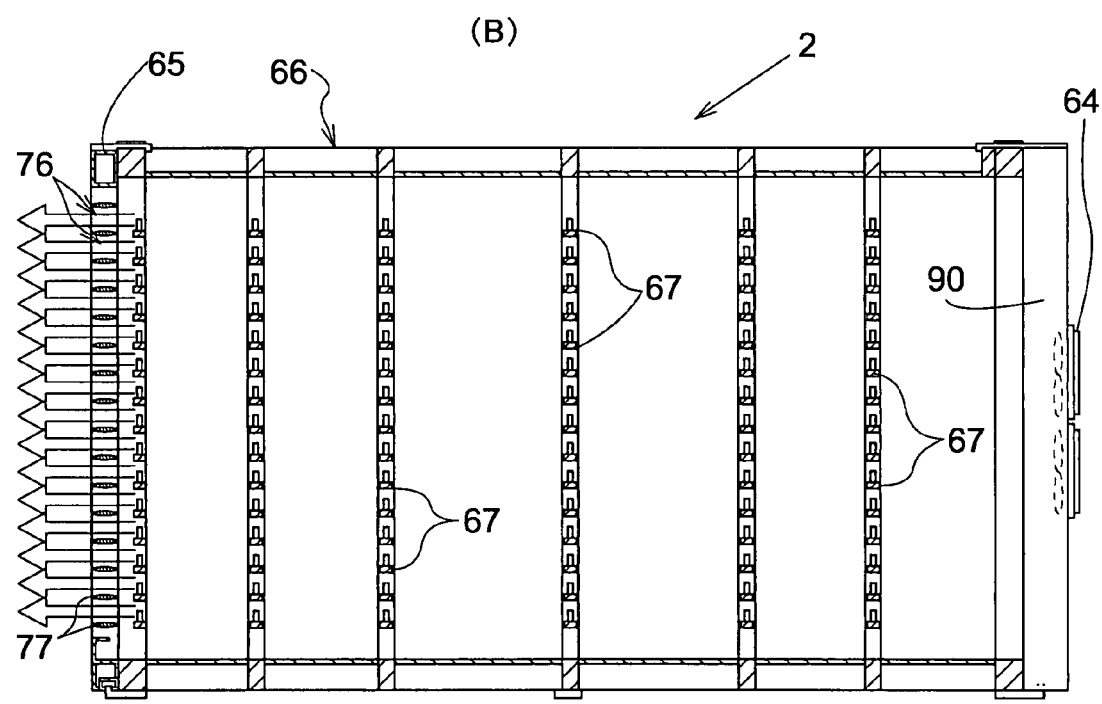

FIG.19
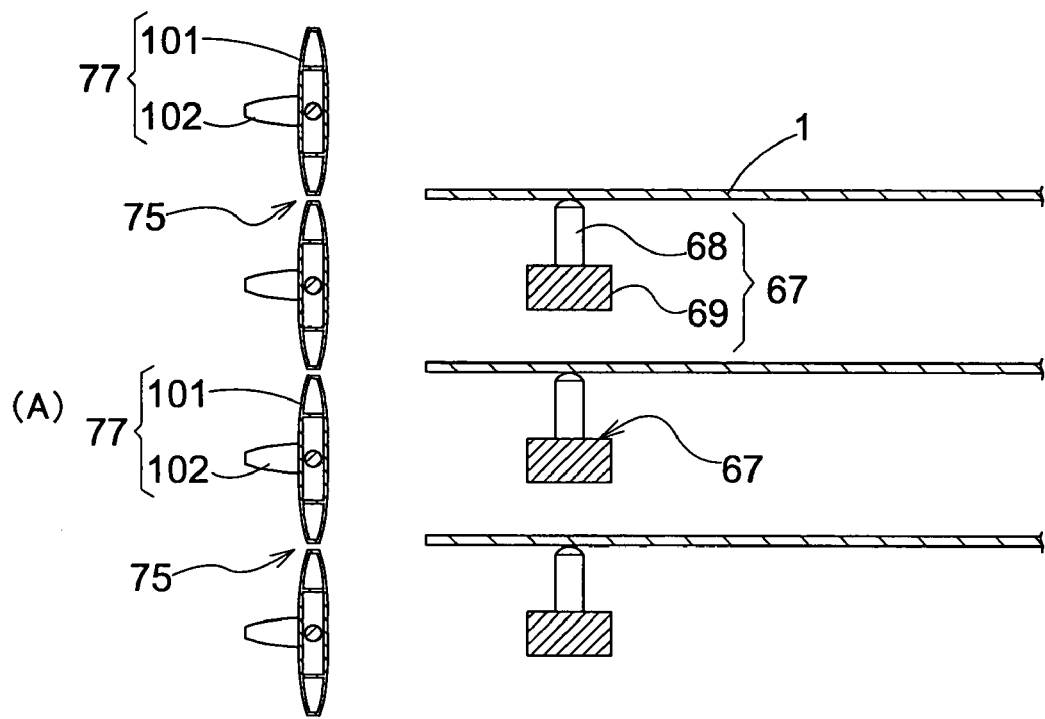
(A)
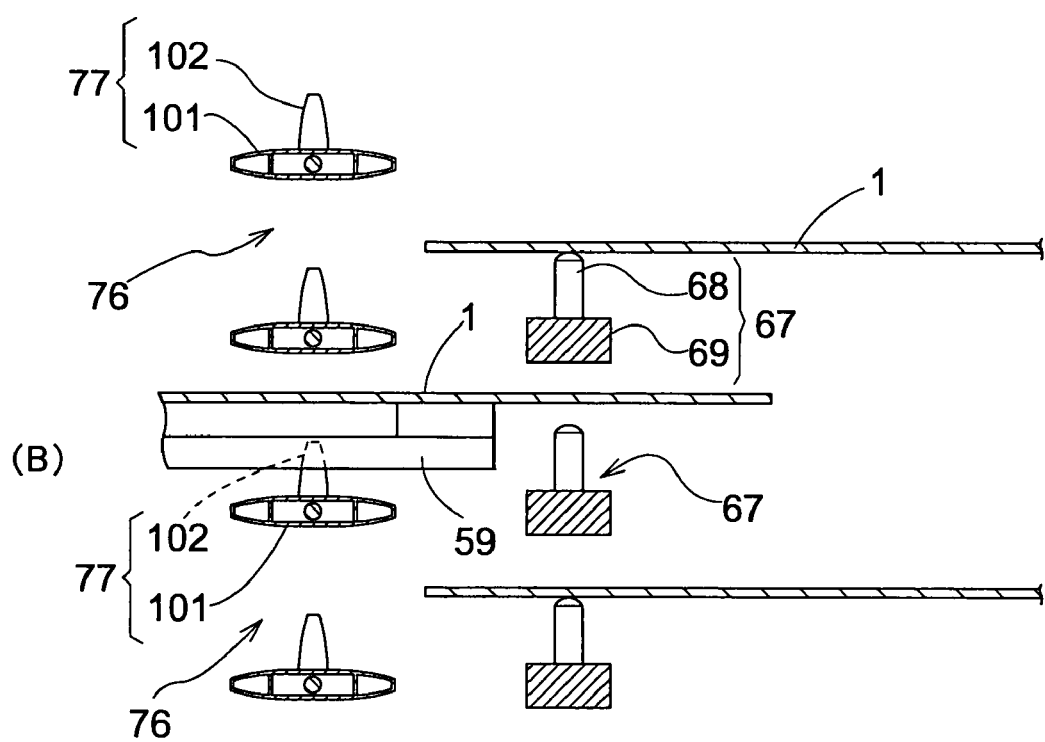
(B)

FIG.21
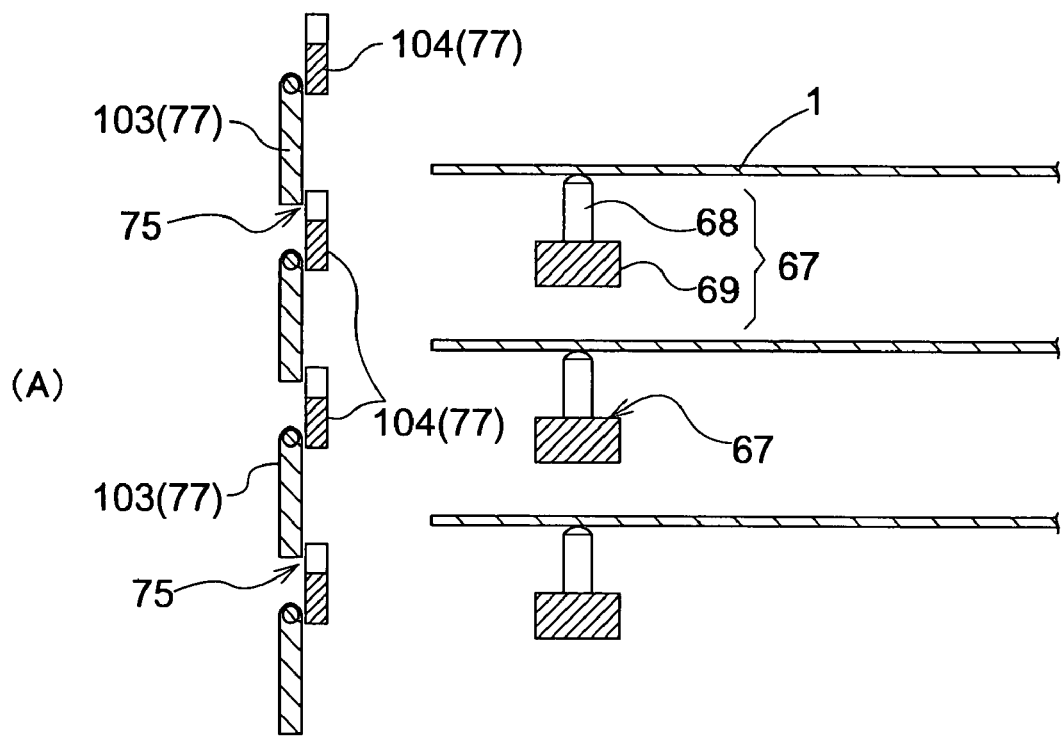
(A)
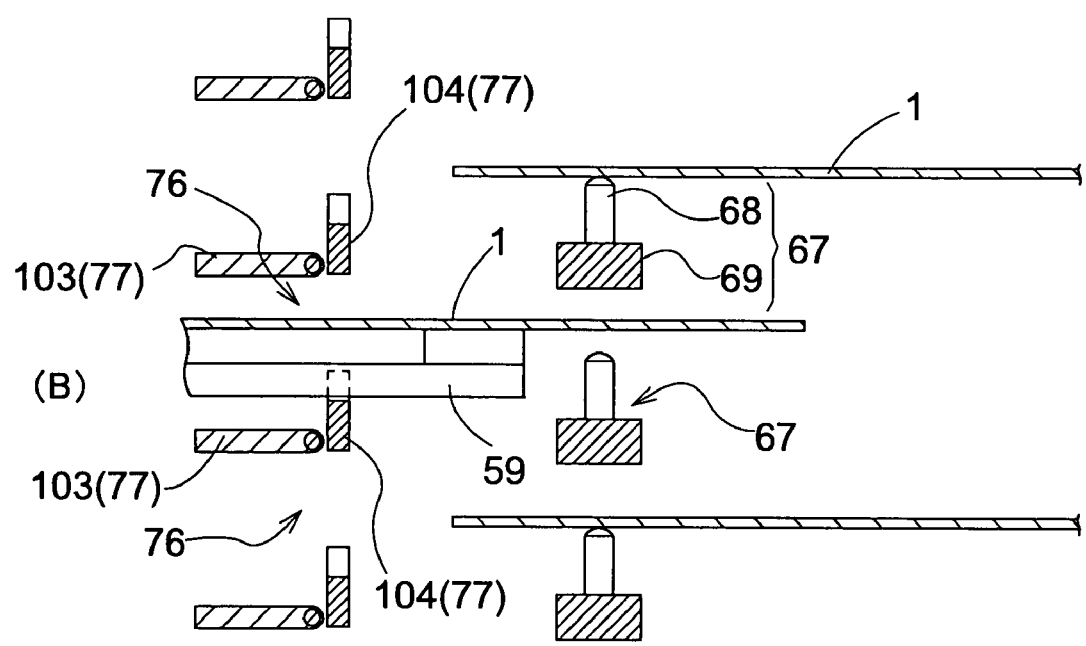
(B)

FIG.24
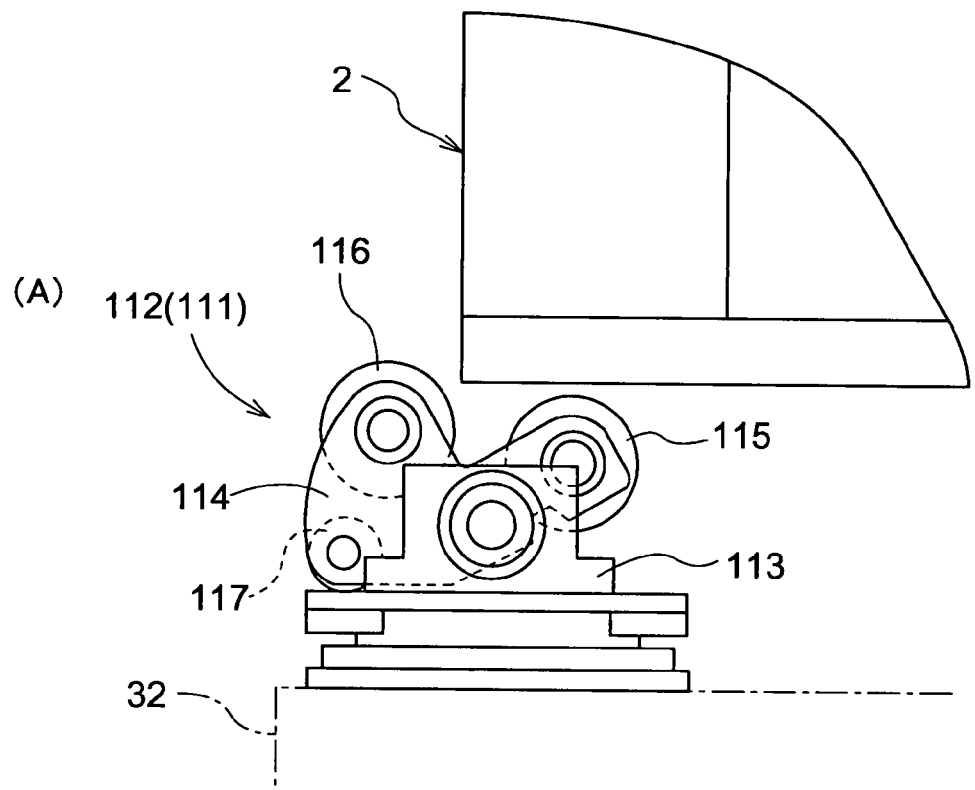
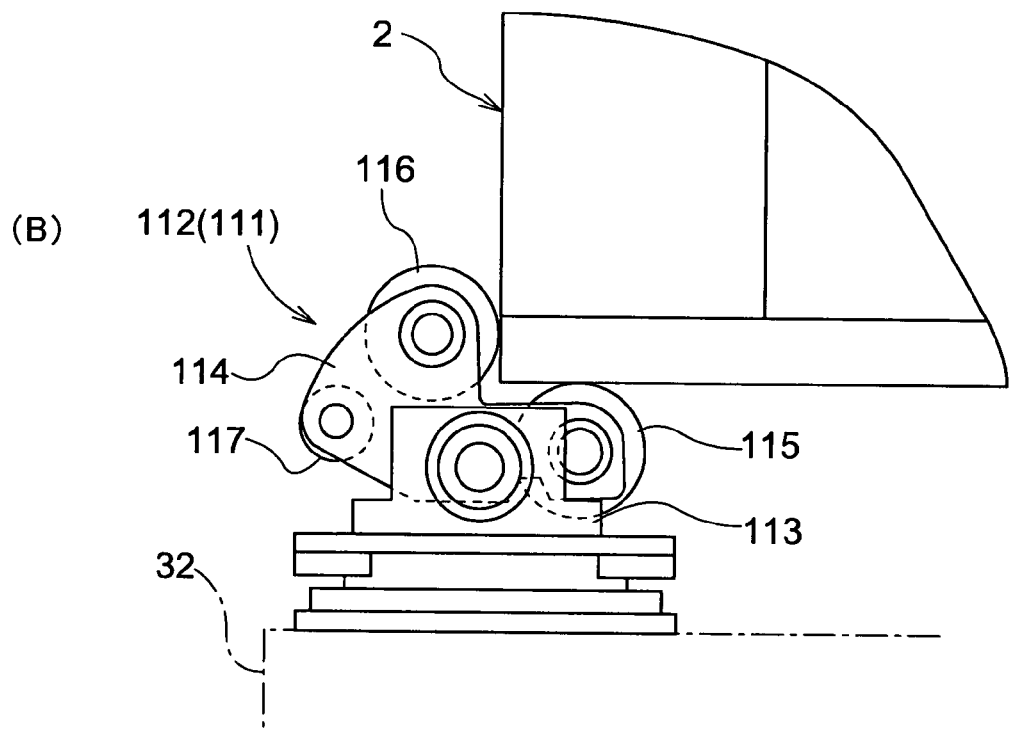

FIG.30
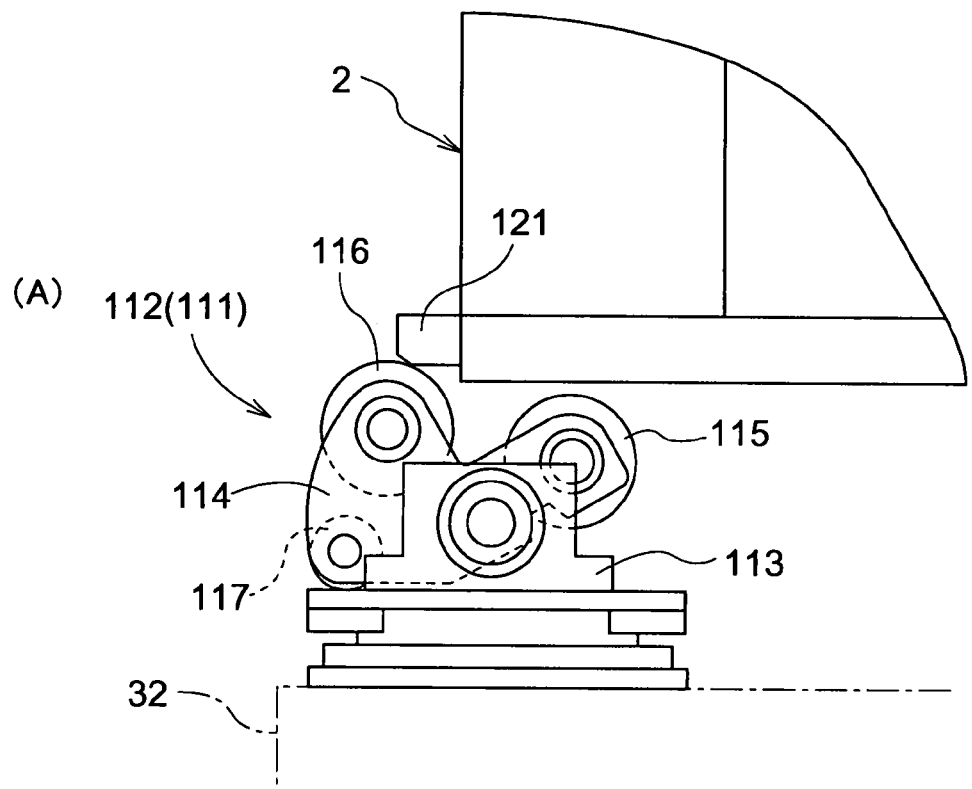
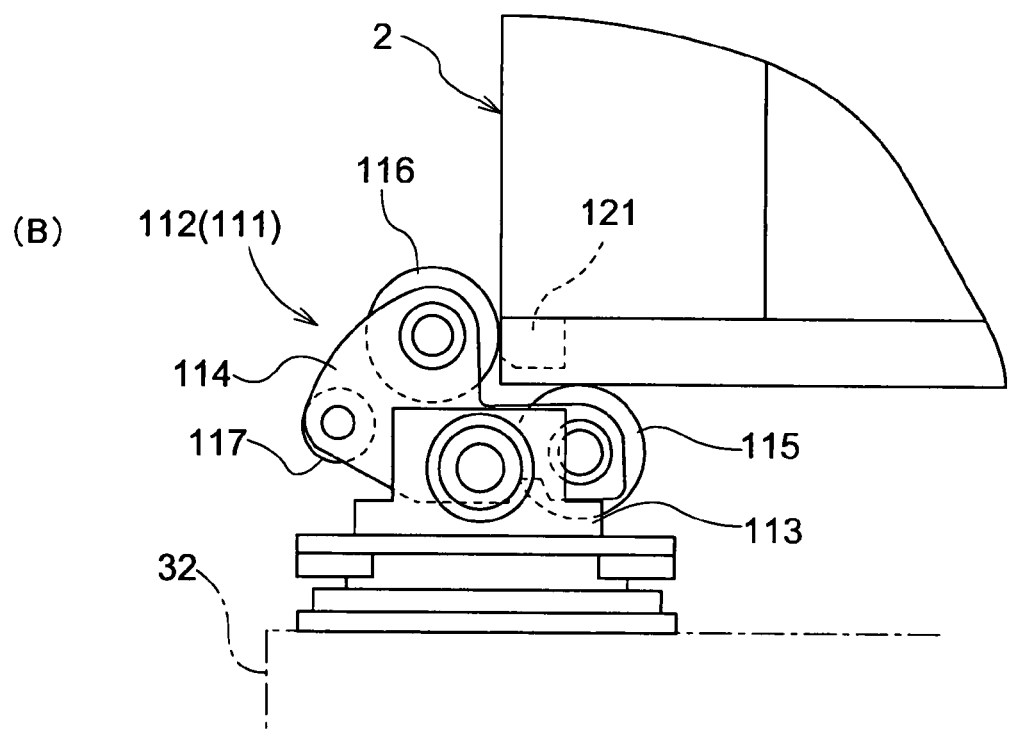

CONTAINER FOR STORING SUBSTRATE HAVING VENTILATED LID AND FAN

BACKGROUND OF THE INVENTION

The present invention relates to a container for storing substrates that vertically holds a plurality of substrates aligned at certain intervals.

Such a container for storing substrates is used for storing substrates such as glass substrates used for liquid display devices or plasma display devices.

In such a container for storing substrates, conventionally, an opening on one end side of a container main unit formed in a tube shape that extends horizontally is configured as an entrance for loading and unloading substrates one at a time, and a fan filter unit, which performs ventilation from an opening on the other end side toward the entrance of the container main unit, is provided at an opening portion on the other end side of the container main unit (for example, see JP 2001-308169A).

In the above-described container for storing substrates, by performing ventilation with clean air (or filtered air) from an opening on the other end side toward the entrance of the container with the fan filter unit, the clean air being discharged from the entrance, dust present inside the container is prevented from attaching to the substrate and also, outside air is prevented from entering inside the container even when airflow around the container is disturbed due to operation of the container transfer device or the like, thereby maintaining purity of substrates in the container.

However, although the speed of air in the container for maintaining purity of substrates may be comparatively low as long as dust present inside the container is prevented from attaching to substrates, it is necessary to set the speed of air discharged from the container comparatively high in order to prevent back flow of the outside air from the entrance. Therefore in terms of the ventilation flow rate of the fan filter unit, the speed of air discharged from the container needs to be comparatively high, which increases the running cost of the fan filter unit.

SUMMARY OF THE INVENTION

The present invention has been achieved in view of the above issues, and the object thereof is to provide a container for storing substrates capable of suppressing the running cost of the fan filter unit.

The container configured to hold a plurality of substrates lined up vertically with space therebetween of the present invention includes:

a container main unit that is tubular having a generally quadrangular cross section, the container including a first opening provided on one end side and a second opening provided on the other end side spaced apart in the horizontal direction from the first opening, the first opening serving as an entrance for loading and unloading the substrates;

a fan filter unit that is provided in an area of the second opening and that causes movement of air from the second opening toward the first opening; and a lid configured to be attached in an area of the entrance of the container main unit, the lid having an open state and a closed state, and forming a ventilation opening that allows air to pass in the closed state.

Accordingly, even when the lid is closed, by performing ventilation with clean air from the opening on the other end side toward the entrance of the container with the fan filter unit, the clean air being discharged from partial openings formed in the entrance, dust present inside the container is prevented from attaching to substrates and also outside air is prevented from entering inside the container, thereby maintaining purity of substrates in the container.

Also, when the lid is closed, since the container is ventilated with clean air from the opening on the other end side toward the entrance of the container with the fan filter unit, the clean air being discharged from the entrance, the speed of clean air discharged is increased at the entrance as a result of the airflow path being narrowed by the lid. Therefore, even if the ventilation flow rate of the fan filter unit is set comparatively low, the speed of discharged clean air is increased so that outside air is prevented from entering inside the container through the entrance.

Accordingly, when the lid is closed, since purity of the substrate can be maintained even if the ventilation flow rate of the fan filter unit is set comparatively small, it is possible to reduce the running cost of the fan filter unit by reducing the ventilation flow rate of the fan filter unit.

BRIEF DESCRIPTION OF THE DRAWINGS

FIG. 17 is a side view illustrating closed and open states of the lid of the first embodiment.

FIG. 19 is a side view illustrating closed and open states of the lid of another embodiment.

FIG. 21 is a side view illustrating closed and open states of the lid of another embodiment.

FIG. 24 is a side view illustrating a support and operation mechanism of the second embodiment.

FIG. 30 is a side view illustrating a support and operation mechanism of another embodiment.

DETAILED DESCRIPTION OF PREFERRED EMBODIMENTS

The following is a description of preferred embodiments of the present invention, with reference to the accompanying drawings. In the following, while a plurality of embodiments are disclosed, any combination of characteristics of a certain embodiment and those of another embodiment is also considered to fall under the scope of the present invention.

First Embodiment

The following is a description of preferred embodiments of the present embodiment, with reference to the accompanying drawings.

Figure 2:
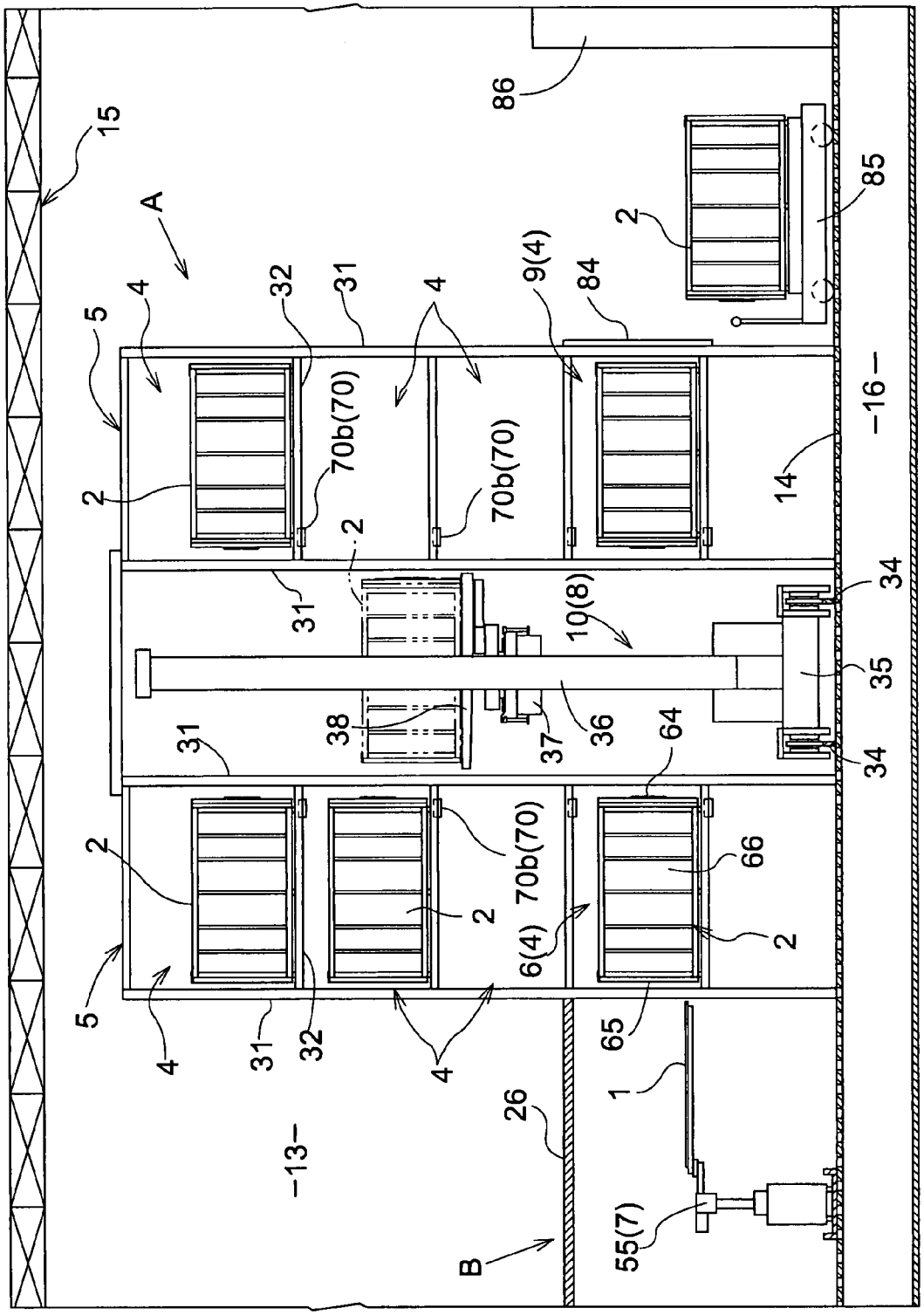
FIG. 2 is a front view of substrate storage facility of the first embodiment.
Figure 6:
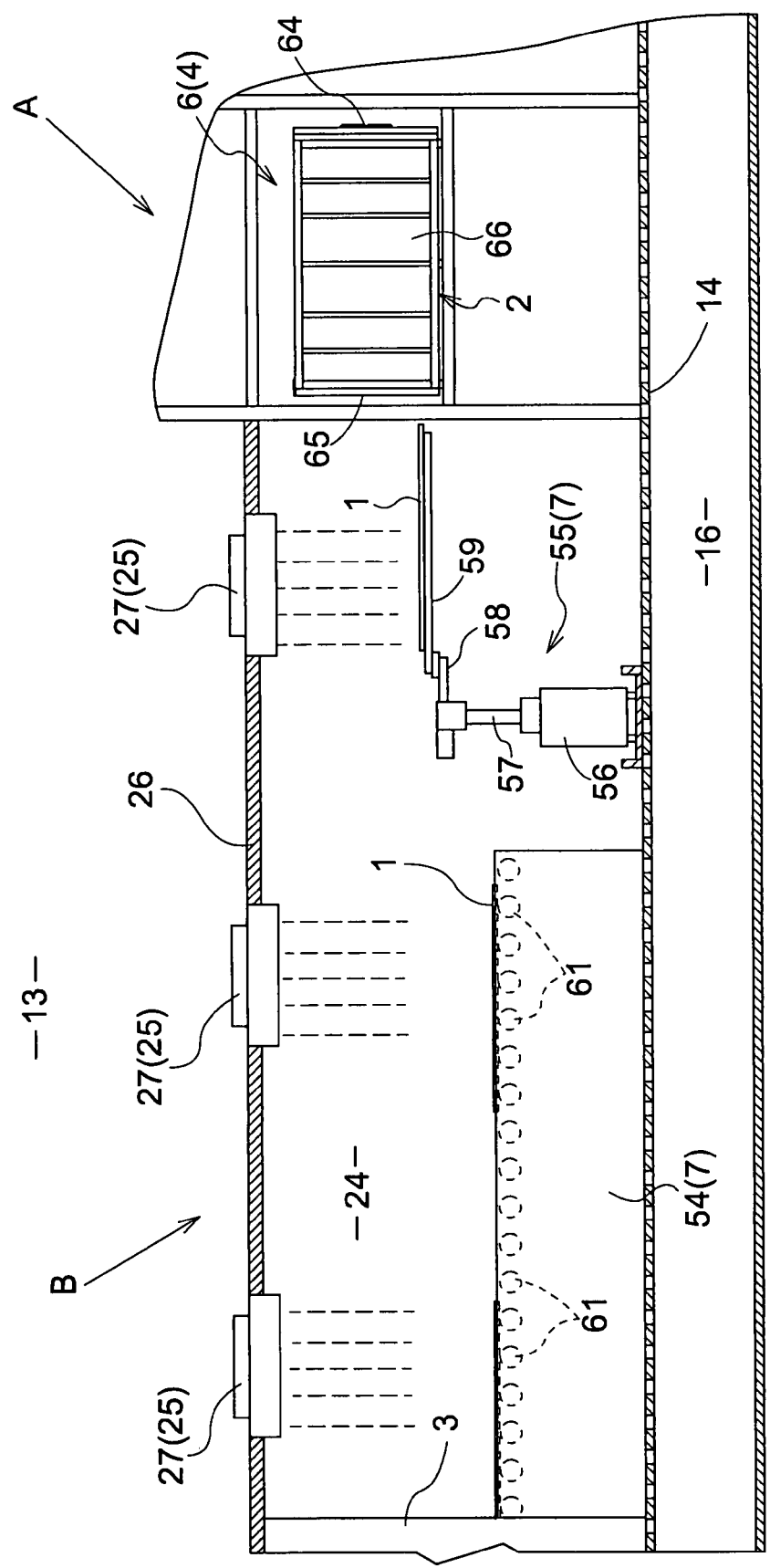
FIG. 6 is a side view illustrating a substrate transfer area of the first embodiment.
Figure 7:
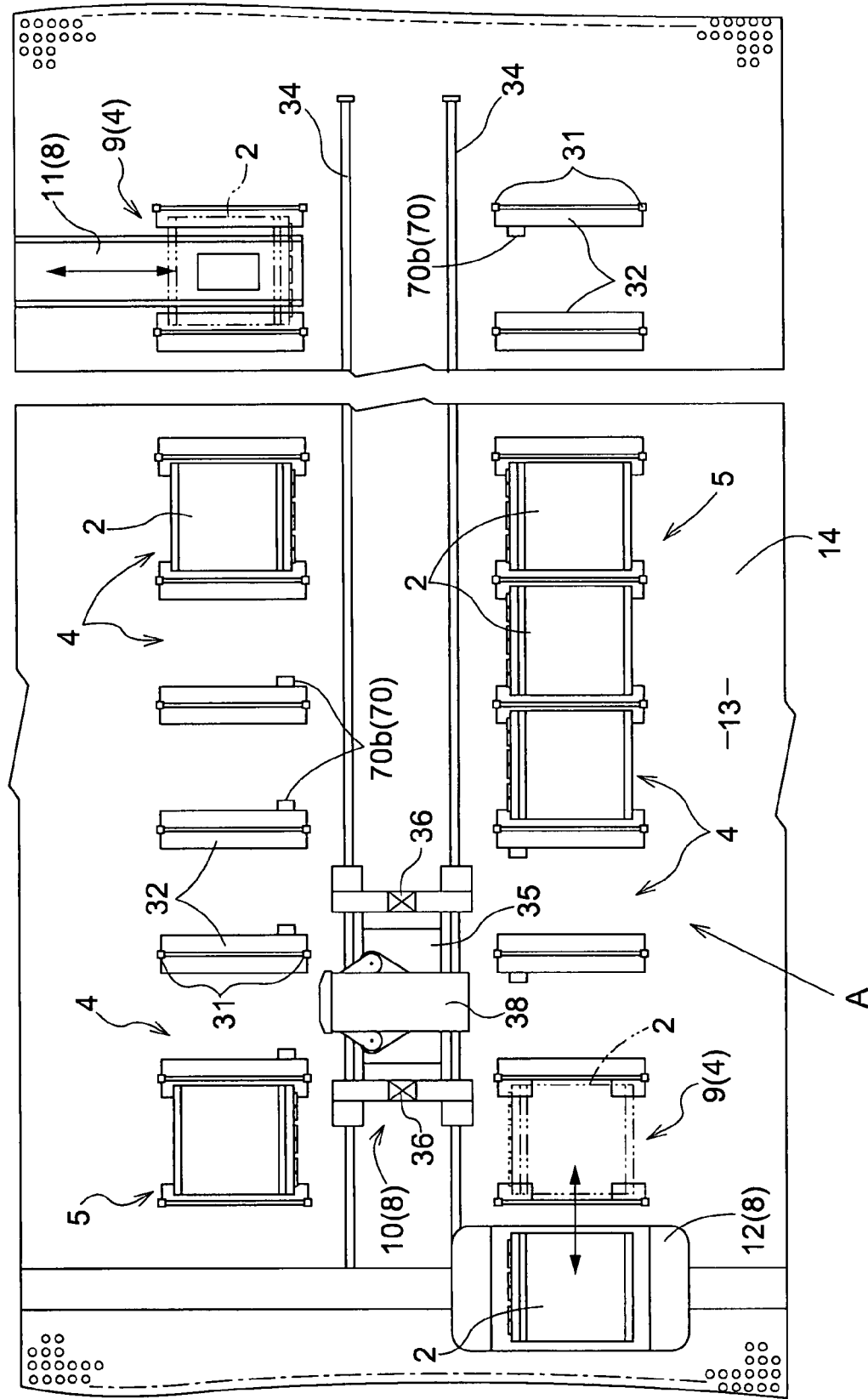
FIG. 7 is a diagram illustrating a storage section at the third level of the storage shelf the first embodiment.

As shown in FIGS. 2 and 6, substrate processing facility includes a plurality of substrate processing devices 3 that process a substrate 1 having, for example, a rectangular shape, a storage shelf 5 including a plurality of storage sections 4 that store a container 2 that vertically holds a plurality of substrates 1 aligned at certain intervals, a substrate transfer device 7 that takes out the substrates 1 one at a time from the container 2 positioned in a substrate loading/unloading section 6 for each of a plurality of the substrate processing device 3 so as to supply the substrate taken out to the corresponding substrate processing device 3, and store the substrate 1 removed from the substrate processing device 3 into the container 2 positioned in the substrate loading/unloading section 6, and a container transfer device 8 that transfers the container 2 to the substrate loading/unloading section 6 of each of the plurality of the substrate processing devices 3 and the storage sections 4 of the storage shelf 5.

Figure 1:
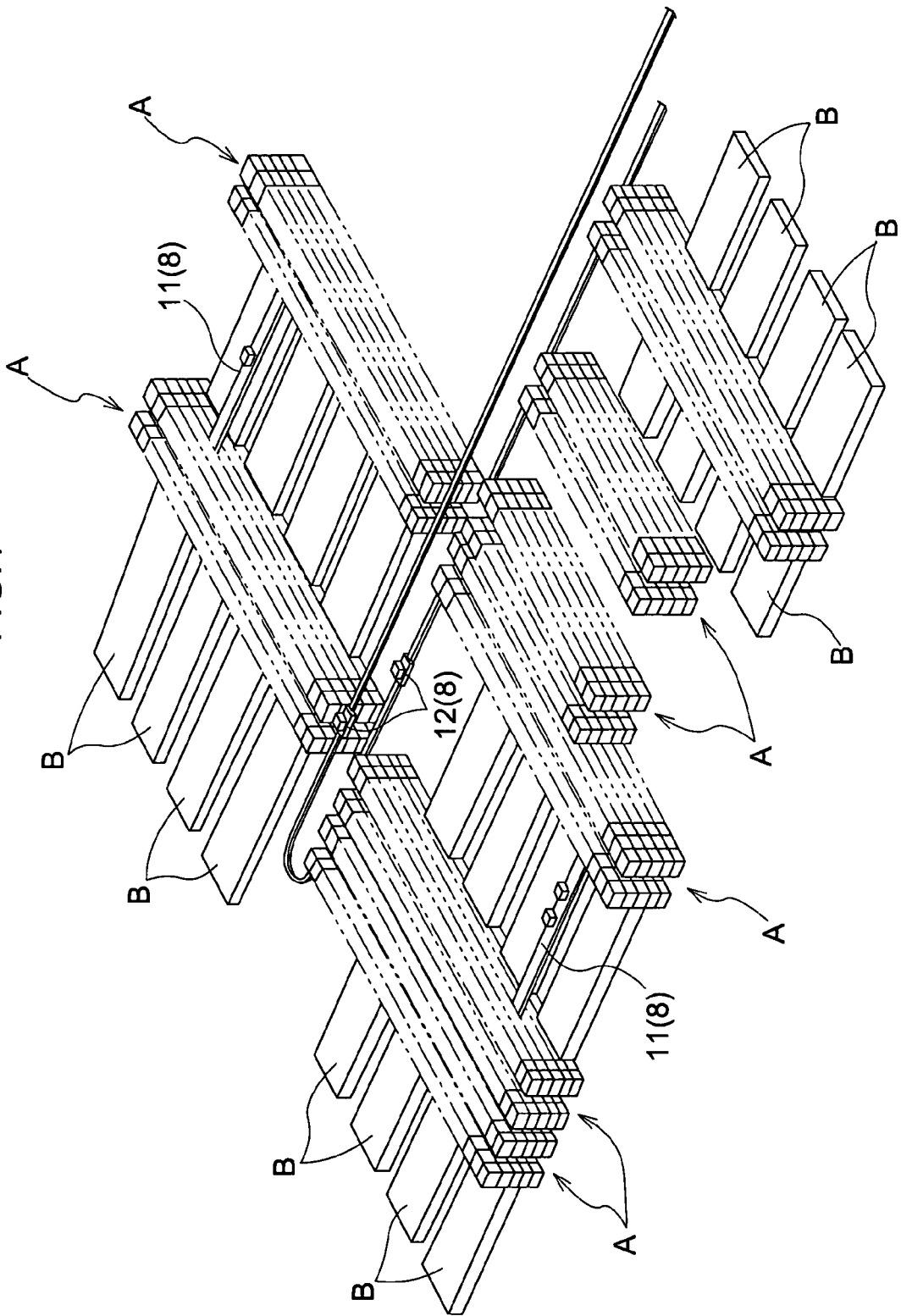
FIG. 1 is a perspective view of substrate processing facility of a first embodiment.

As shown in FIG. 1, the substrate processing facility is provided with plural units of substrate storage facility A and process step facility B. As shown in FIG. 2, each unit of substrate processing facility A includes the storage shelf 5 and a stacker crane 10 as the container transfer device 8. Also as shown in FIG. 6, each unit of process step facility B includes the substrate processing device 3 and the substrate transport device 7.

This substrate processing facility employs a substrate processing method in which the containers 2 are stored in the storage shelf 5 and the stored containers 2 are sequentially transferred to the substrate loading/unloading section 6 of each of a plurality of the substrate processing devices 3, and then the substrates 1 are sequentially processed by a plurality of the substrate processing devices 3 so as to manufacture processed substrates.

That is, operations of the substrate transfer device 7 and the container transfer device 8 are controlled by a control device (not shown). The control device controls operations of the substrate transfer device 7 and the container transfer device 8 as follows. The container transfer device 8 sequentially transfers the containers 2 to the substrate loading/unloading section 6 of each of a plurality of the substrate processing devices 3. Every time the container 2 is transferred to the substrate loading/unloading section 6, the substrate transfer device 7 takes out the substrates 1 one at a time from the container 2 so as to supply the substrate 1 taken out to the substrate processing device 3, and stores the substrate 1 removed from the substrate processing device 3 in the container 2. This control device includes components such as microprocessor, a communication section, a memory, algorithms stored in the memory, which are required to perform all functions described in this specification. In addition, this control device may be arranged on the floor of the equipment, or may be arranged in the container transfer unit or the storage shelf 5.

A plurality of substrate processing devices 3 independently perform prescribed processes such as coating, exposure and developing, and therefore they sometimes vary in the processing amount of the substrate 1. The control device controls operations of the container transfer device 8 such that when any time lag occurs in processing a certain substrate 1 during sequential transfer to the loading/unloading section 6, the container 2 that stores the certain substrate 1 to be processed is temporarily stored in the storage shelf 5.

As the container transfer device 8, the stacker crane 10, which is a container transfer unit for the storage shelf and provided corresponding to the storage shelf 5, and a reciprocating trolley 11 and a circulating trolley 12, which are container transfer units between shelves that transfer the container 2 between a plurality of loading/unloading sections 9 in each of a plurality of storage shelves 5, are provided.

As shown in FIG. 1, the reciprocating trolley 11 and circulating trolley 12 transfer the container 2 outside the substrate storage facility A. The reciprocating trolley 11 reciprocates between two adjacent units of substrate storage facility A, and transfer the container 2 between the two adjacent units. The circulating trolley 12 circulates around plural units of substrate storage facility A, and transfer the container 2 to these plural units.

Also as shown in FIG. 2, the stacker crane 10 transfers the container 2 inside the substrate storage facility A, and reciprocates along a motion space created between a pair of storage shelves 5 arranged facing each other so as to transfer the container 2 between a plurality of storage sections 4 of a pair of the facing storage shelves 5.

Specifically, when the container 2 is transferred to the storage section 4 or the substrate loading/unloading section 6 (as origin of transfer) to the storage section 4 or the substrate loading/unloading section 6 (as transfer destination) with the container transfer device 8, if the origin of transfer and the transfer destination are in different units of substrate storage facility A, the container 2 is sequentially transferred in a relayed manner by the stacker crane 10 of the substrate storage facility A as the origin of transfer, reciprocating trolley 11, circulating trolley 12, and the stacker crane 10 of the substrate storage facility A as the transfer destination, in this order. If the origin of transfer and the transfer destination are in the same unit of substrate storage facility A, the container 2 is transferred by the stacker crane 10 of that unit of substrate storage facility A.

Figure 4:
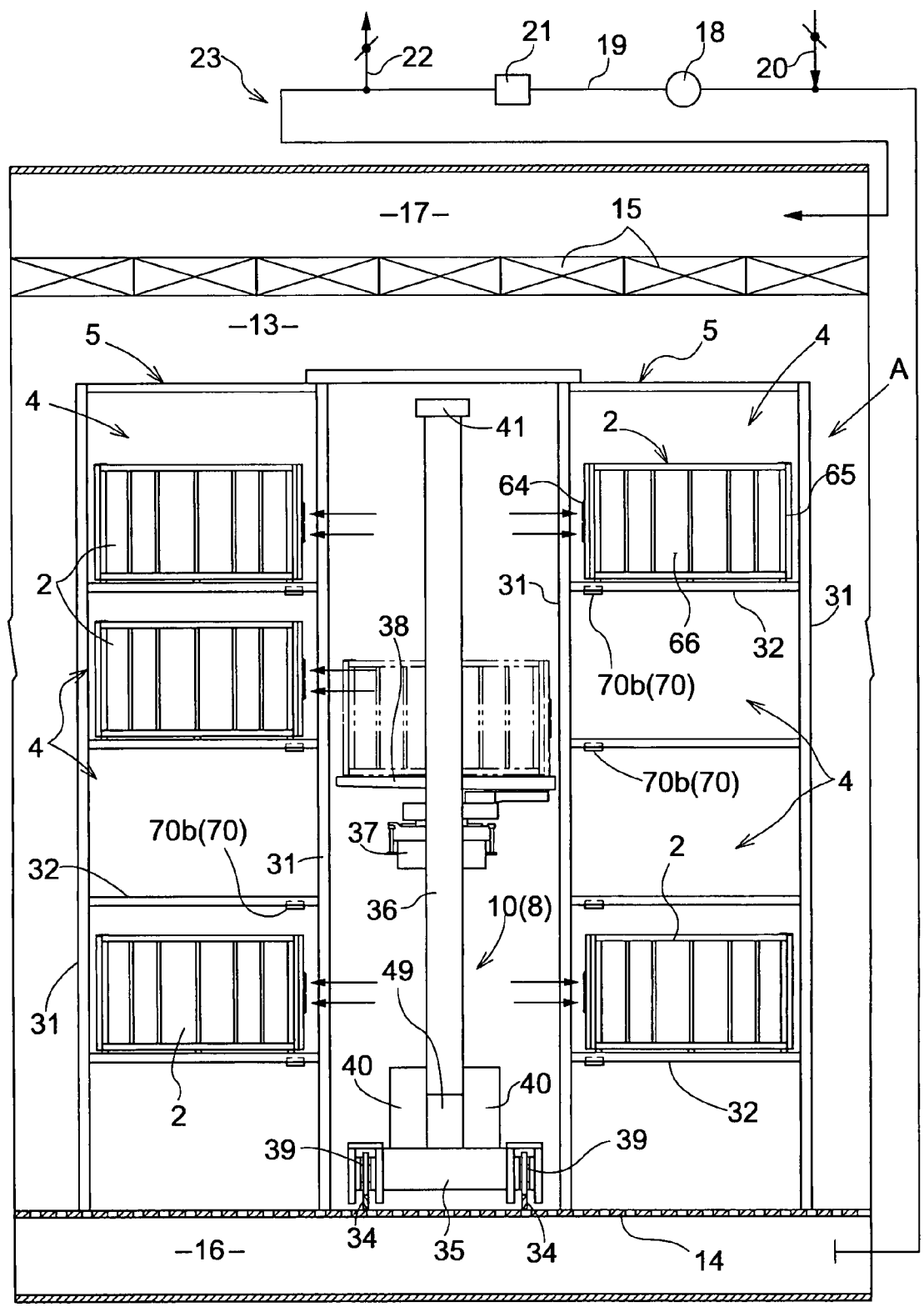
FIG. 4 is a diagram illustrating a clean air ventilation means of the first embodiment.

As shown in FIG. 4, the substrate processing facility includes a down-flow type clean air ventilation means 23, which ventilates a clean space 13 with clean air (or filtered air) from the ceiling portion to the floor portion of the clean space 13. In the clean space 13 with the down-flow ventilation, a plurality of substrate processing devices 3, the storage shelves 5, the substrate transfer device 7, and the container transfer device 8 are provided. The substrate storage facility A is provided so as to be open to the surrounding area, and is configured such that clean air can flow into and from the substrate storage facility A.

Further explanation of the clean air ventilation means 23 is provided below. As shown in FIG. 4, in the clean air ventilation means 23, the floor portion of the clean space 13 is formed by a porous grating floor 14, and the ceiling portion of the clean space 13 is formed by an air filter 15 composed of an HEPA filter and the like. An air intake chamber 16 formed below the grating floor 14 and a chamber 17 formed above the air filter 15 are communicated via a circulation path 19 provided with a ventilation fan 18 and a pre-filter 21. With the ventilation fan 18, air in the clean space 13 is taken in to the circulation path 19 via the grating floor 14 and the air intake chamber 16, and the air taken in is blown downward to the clean space 13 as clean air via the pre-filter 21, the chamber 17 and the air filter 15. In this manner, air in the clean space 13 is circulated while being purified with the pre-filter 21 and the air filter 15, thereby passing clean air from the ceiling portion to the floor portion. The circulation path 19 is connected to an outside air intake path 20 on the upstream side from the ventilation fan 18, and an air discharge path 22 on the downstream side from the ventilation fan 18, and part of air in the clean space 13 circulated by the clean air ventilation means 23 is exchanged with outside air.

As shown in FIG. 6, the substrate processing facility includes a clean air ventilation means for transfer area 25 that ventilates a transfer area with clean air in order to maintain purity of a substrate transfer area 24 where the substrate transfer device 7 transfers the substrates 1 between the substrate loading/unloading section 6 and the substrate processing device 3.

That is, in the substrate transfer area 24 of the process step facility B, a partition wall 26 that covers the space for substrate transfer operation by the substrate transfer device 7, such that the end portion thereof on the side toward the storage shelf 5 is open and the other end portion thereof on the side toward the substrate processing device 3 is communicated with the substrate processing device 3. A plurality of transfer area fan filter units 27 as the clean air ventilation means for transfer area 25 are provided in the ceiling portion of the partition wall 26. Clean air obtained by further purifying clean air in the clean space 13 by a plurality of transfer area fan filter units 27 is passed from the ceiling portion to the floor portion of the substrate transfer area 24, thereby making the space covered by the partition wall 26 a down-flow ventilation space.

Figure 3:
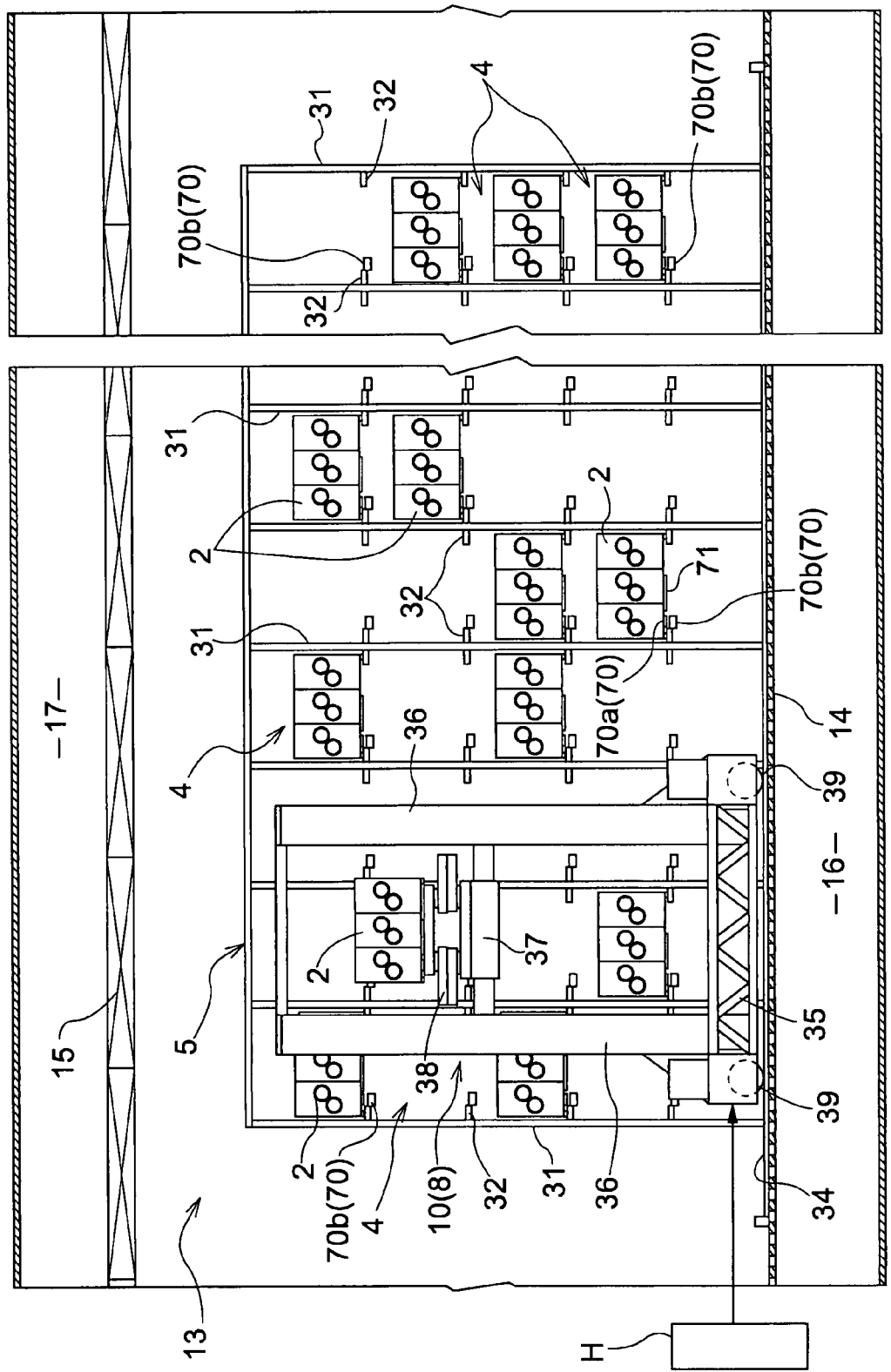
FIG. 3 is a side view of the substrate storage facility of the first embodiment.

As shown in FIGS. 2 to 4, the storage shelf 5 is constituted by a pair of front and rear columns 31 provided erect on the grating floor 14 and spaced apart in the shelf longitudinal width direction, and mount and support sections 32 disposed bridging the pair of front and rear columns 31 and arranged at certain intervals in the vertical direction.

In the storage shelf 5, a plurality of storage sections 4, which are formed by a pair of front and rear column 31 and a pair of right and left mount and support sections 32, are provided arranged vertically and horizontally. The storage sections 4 adjacent in the shelf longitudinal width direction and the vertical direction are communicated to each other such that air can flow therethrough.

The storage sections 4 at the lowest level are arranged above the grating floor 14 so as to create an interval between them. Below the storage sections 4 at the lowest level, a flow space is formed where clean air flows.

Part of a plurality of storage sections 4 of the storage shelf 5 serve as the substrate loading/unloading section 6, and part of a plurality of storage sections 4 of the storage shelf 5 serve as the loading/unloading section 9.

Figure 5:
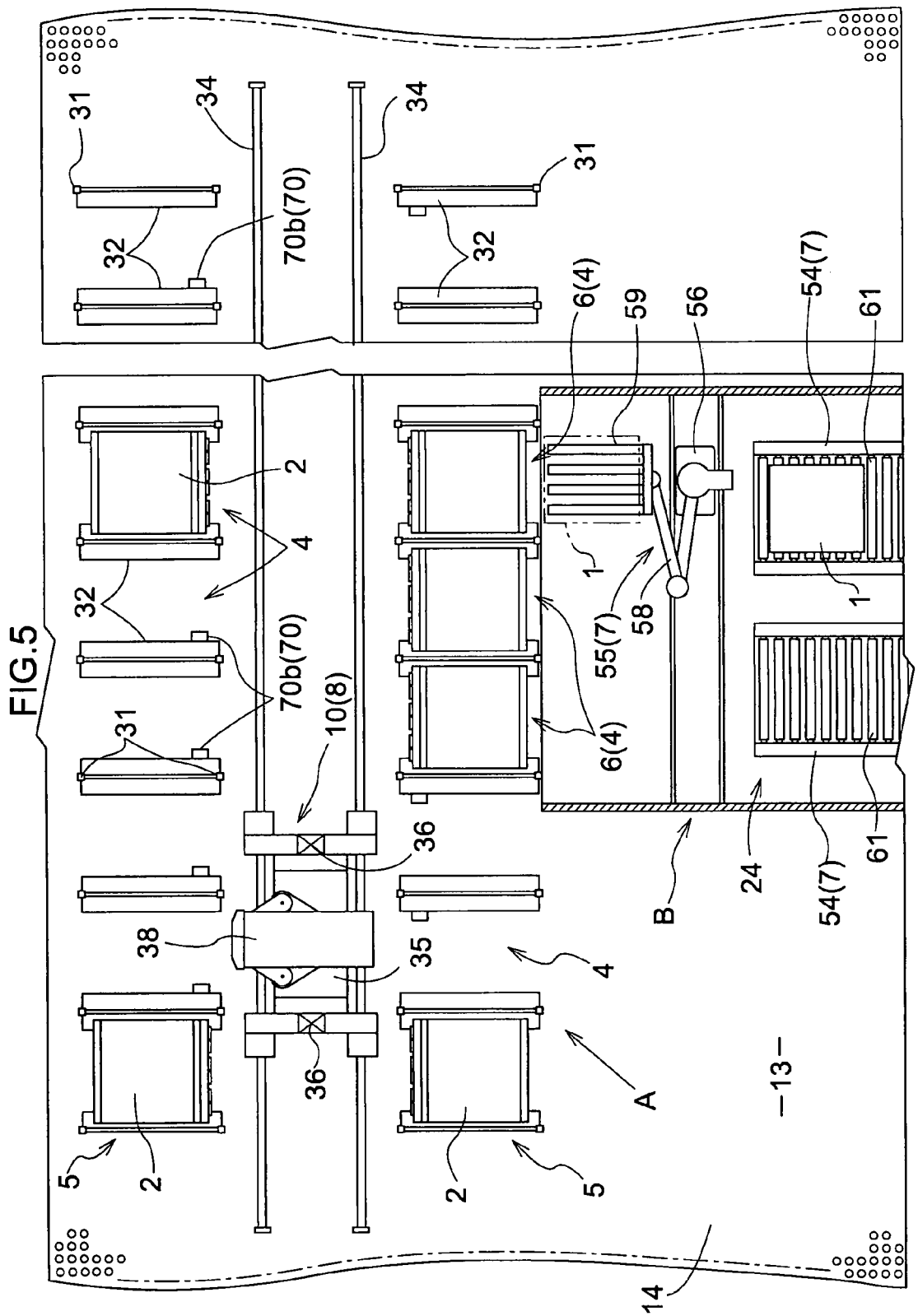
FIG. 5 is a diagram illustrating a storage section at the first level of the storage shelf of the first embodiment.

Further description is provided below. As shown in FIG. 5, of a plurality of storage sections 4 at the lowest level of the storage shelf 5, the storage sections 4 that correspond to the substrate processing device 3 serve as the substrate loading/unloading section 6, which are configured such that the substrate transfer device 7 can take out or store the substrates 1 one at a time through the rear face side of the storage shelf 5 with respect to the container 2 positioned in the substrate loading/unloading section 6. Further, since the storage sections at the lowest level are arranged above the grating floor 14 so as to create an interval between them as described above, the substrate loading/unloading section 6 is positioned higher than the floor portion.

As shown 7, of a plurality of storage sections 4 at a middle level of the storage shelf 5, the storage sections 4 that correspond to the reciprocating trolley 11 and the circulating trolley 12 serve as the loading/unloading sections 9. The loading/unloading section 9 that corresponds to the reciprocating trolley 11 is configured such that the container 2 can be loaded and unloaded through the rear face side of the storage shelf 5 by the reciprocating trolley 11, and further, the loading/unloading section 9 that corresponds to the circulating trolley 12 is configured such that the container 2 can be loaded and unloaded through the lateral face side of the storage shelf 5 by the circulating trolley 12.

Figure 8:
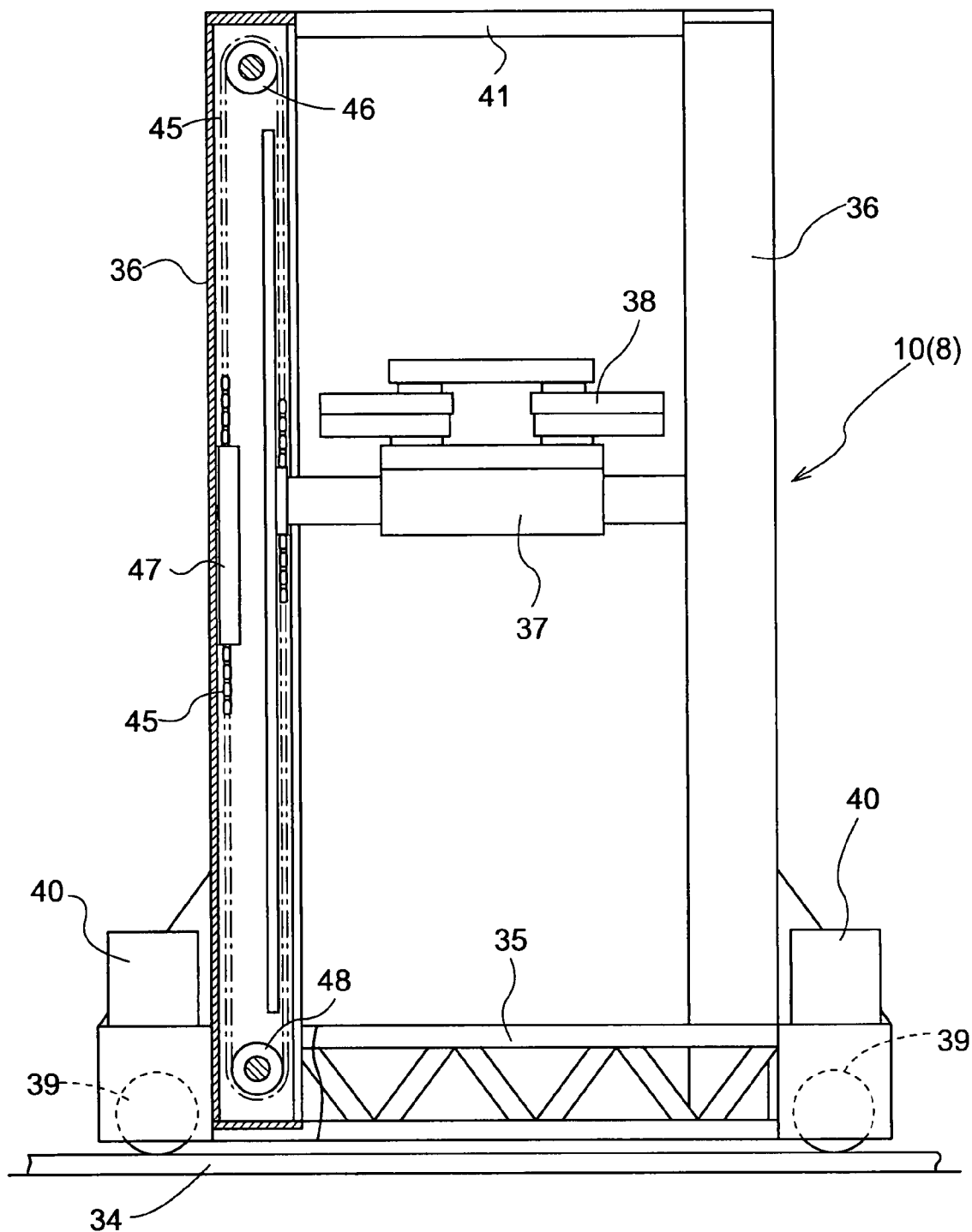
FIG. 8 is a side view of a stacker crane of the first embodiment.

As shown in FIGS. 2, 3 and 8, the stacker crane 10 includes a travel dolly 35 that travels along two travel rails 34 disposed along the longitudinal direction on the travel path in front of the storage shelf 5, an elevator platform 37 guided and supported by a pair of elevator masts 36 so as to be capable of freely ascending and descending along the elevator masts 36 provided erect on the travel dolly 35, and a folk-type article transfer device 38 supported by the elevator platform 37 capable of transferring the container 2 between the storage section 4 and itself. The stacker crane 10 can freely travel in the motion space in front of the storage shelf 5 in the shelf longitudinal width direction due to horizontal motion of the travel dolly 35, ascending/descending motion of the elevator platform 37 and operations of the article transfer device 38, and transfers the container 2 to the substrate loading/unloading section 6, the loading/unloading section 9 and the storage sections 4 of the storage shelf 5 other than those serving as the substrate loading/unloading section 6 or the loading/unloading section 9.

The travel dolly 35 is provided with a total of four travel wheels 39, two front and rear tires for each of two travel rails 34, and a travel motor 40 rotationally drives each travel wheel 39 so that the travel dolly 35 travels along the travel path.

The respective upper end portions of a pair of elevator masts 36 are connected via an upper frame 41.

As shown in FIG. 8, to each of end portions in the front-and-rear direction of the elevator platform 37, one end portions of a pair of elevating chains 45 are connected. One of the pair of elevating chains 45 is wound around a guiding sprocket 46 provided in an upper end portion of the elevator mast 36 with the other end thereof being connected to a balance weight 47. The other of the pair of elevating chains 45 is wound around a driving sprocket 48 provided in a lower end portion of elevator mast 36 with the other end thereof being connected to the balance weight 47. By rotationally driving the driving sprocket 48 using an elevator motor 49, the elevator platform 37 is ascended and descended.

Figure 9:
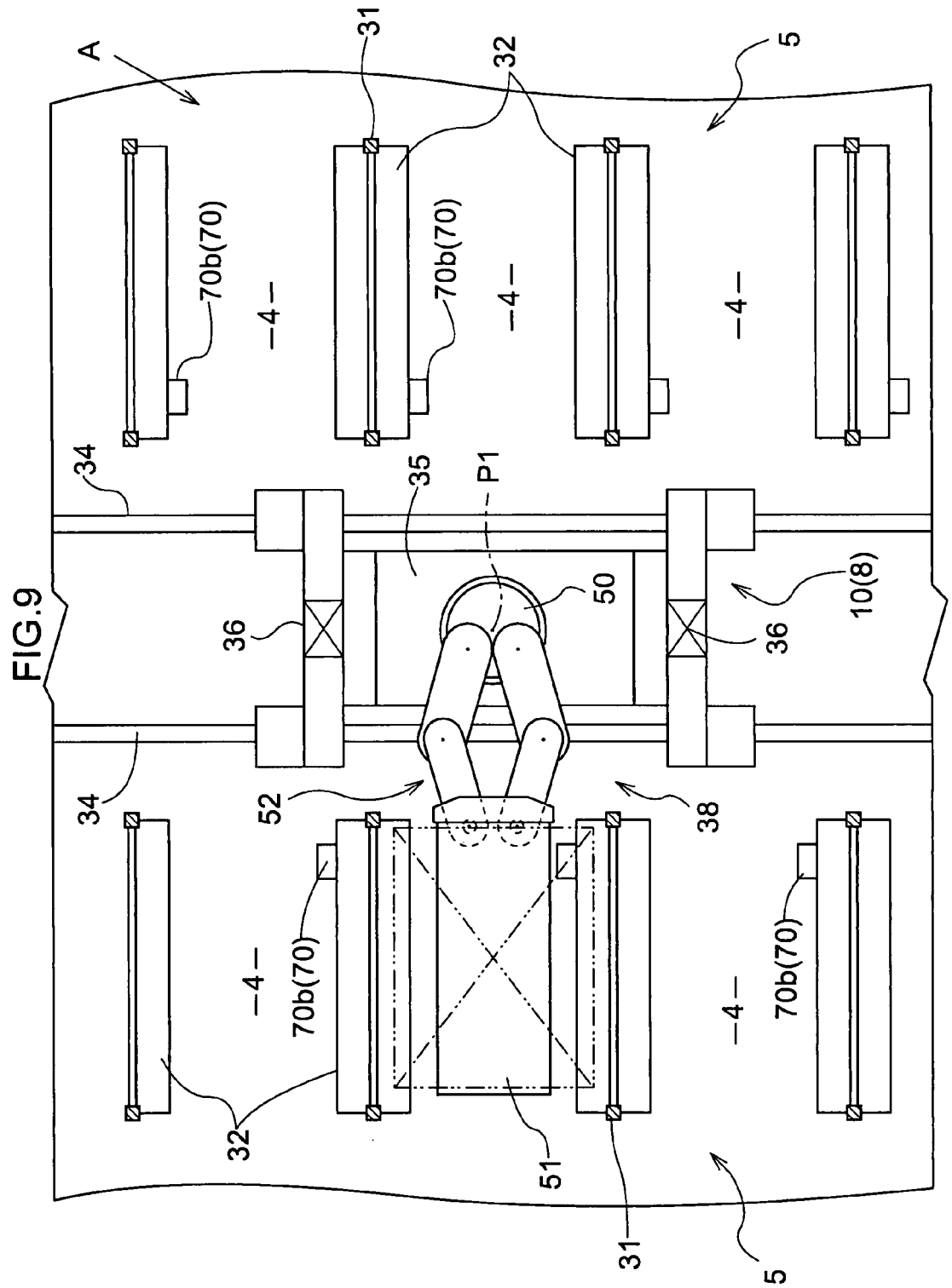
FIG. 9 is a plan view of an article transfer device of the first embodiment.

As shown in FIG. 9, the article transfer device 38 includes a revolving table 50 capable of freely revolving around a vertical axis P1, and a link mechanism 52 that supports a mount section 51 provided above the revolving table 50 such that the mount section 51 can be freely extended and withdrawn. The article transfer device 38 can move the mount section 51 in a revolving manner through revolution of the revolving table 50, and also can switch the state thereof between a state withdrawn above the elevator platform 37 (see FIG. 5) and a state extended toward the storage section 4, due to extension and retraction of the link mechanism 52. The article transfer device 38 corresponds to a revolving means that enables revolving of the container 2 supported.

As shown in FIG. 3, the substrate storage facility A includes a control means H that controls operations of the stacker crane 10.

The control means H is configured so as to control operations of the stacker crane 10 such that the container 2 is transferred between a plurality of storage sections 4, by controlling operations of the travel motor 40, the elevator motor 49 and the article transfer device 38 based on instructions of a superior control device that manages operations of the container transfer device 8.

The control means H, in both of a pair of the storage shelves 5, is configured so as to control operations of the container transfer device 8 such that the container 2 is stored in the storage section 4 in a state in which the side of the container 2 on which a fan filter unit 64 is provided is positioned on the side toward the motion space, and the side of the container 2 toward an entrance 72 is positioned on the side away from the motion space. The fan filter unit 64 (also referred to as FFU) includes a fan, an electric motor that drives the fan, a filter, a battery 71 and a power receiving section 70a that transfer power to the battery 71 or the electric motor, which are supported by a single FFU frame unit 90. The fan revolves around an axis that extends horizontally.

That is, the control means H is configured so as to control operations of the stacker crane 10 such that, when the container 2 is transferred between a pair of facing storage shelves 5, if the storage section 4 as the origin of transfer and the storage section 4 as the transfer destination are in the same storage shelf 5, a container 2 is removed from the storage section 4 as the origin of transfer, and stored in the storage section 4 as the transfer destination without revolving the container 2 by the article transfer device 38, so that the container 2 is stored, also in the storage section 4 as the transfer destination, in a state in which the side of the container 2 on which the fan filter unit 64 is provided is positioned on the side toward the motion space, and the side of the container 2 on which a lid 65 is provided (the entrance side) is positioned on the side away from the motion space, as in the storage section 4 as the origin of transfer. Furthermore, the control means H is configured so as to control operations of the stacker crane 10 such that, if the storage section 4 as the origin of transfer and the storage section 4 as the transfer destination are in different storage shelves 5, the container 2 is removed from the storage section 4 as the origin of transfer, and stored in the storage section 4 as the transfer destination after revolving the container 2 by 180 degrees with the article transfer device 38, so that the container 2 is stored, also in the storage section 4 as the transfer destination, in a state in which the side of the container 2 on which the fan filter unit 64 is provided is positioned on the side toward the motion space, and the side of the container 2 on which the lid 65 is erected is positioned on the side away from the motion space, as in the storage section 4 as the origin of transfer.

As shown in FIGS. 5 and 6, the substrate transfer device 7 includes a substrate transfer conveyer 54 that mounts and transfers the substrate 1 between the substrate processing device 3 and the vicinity of the storage shelf 5, a substrate transfer robot 55 that mounts and transfers the substrate 1 between the container 2 positioned in the substrate loading/unloading section 6 and the end portion of the substrate transfer conveyer 54 on the side toward the storage shelf.

The substrate transfer robot 55 includes a moving dolly 56 that moves in the rear face side of the storage shelf 5 along the shelf longitudinal width direction, and an elevating section 57 supported by the moving dolly 56 so as to be capable of freely accenting and descending, as well as rotating, and a folk-shaped support section 59 connected to the elevating section 57 via a link mechanism 58. The substrate transfer robot 55 is configured so as to transfer the substrates 1 one at a time from the container 2 positioned in the substrate loading/unloading section 6 to the end portion of the substrate transfer conveyer 54 on the side toward the storage shelf through accenting/descending and rotation of the elevating section 57, as well as extension and retraction of the link mechanism 58, and to transfer the substrates 1 at the end portion of the substrate transfer conveyer 54 on the side toward the storage shelf one at a time to the container 2 positioned in the substrate loading/unloading section 6.

As shown in FIG. 6, the substrate transfer conveyer 54 is configured so as to transfer the substrate 1 by rotationally driving a rotation roller 61, while the rotation roller 61 supporting the substrate 1 at both ends thereof in the longitudinal width direction. As shown in FIG. 5, as the substrate transfer conveyer 54, a pre-processing substrate transfer conveyer 54 that transfers unprocessed substrates 1 received from the substrate transfer robot 55 to the substrate processing device 3, and a post-processing substrate transfer conveyer 54 that transfers processed substrates 1 removed from the substrate processing device 3 toward the storage shelf 5 are provided.

Figure 11:
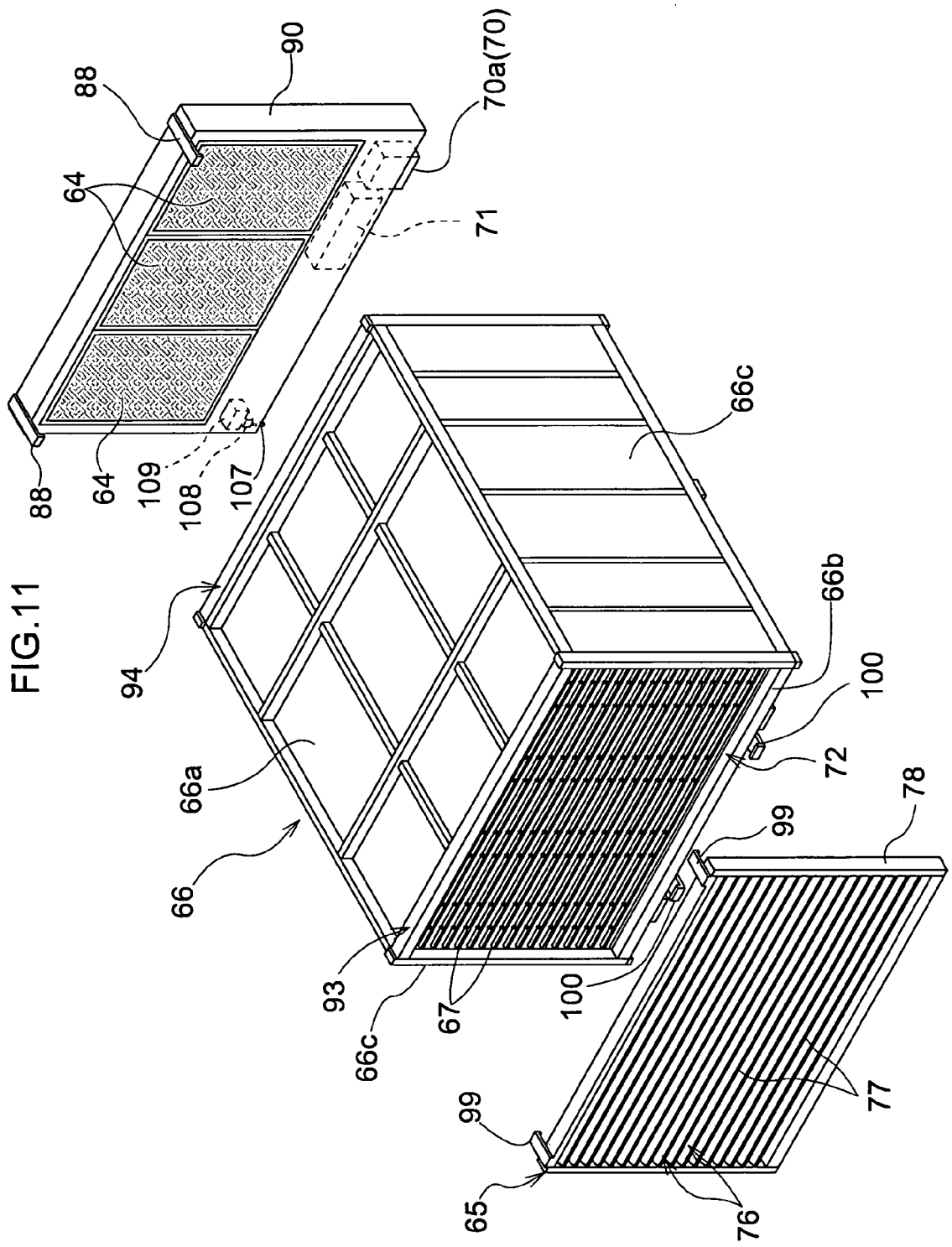
FIG. 11 is an exploded perspective view of a container of the first embodiment.
Figure 12:
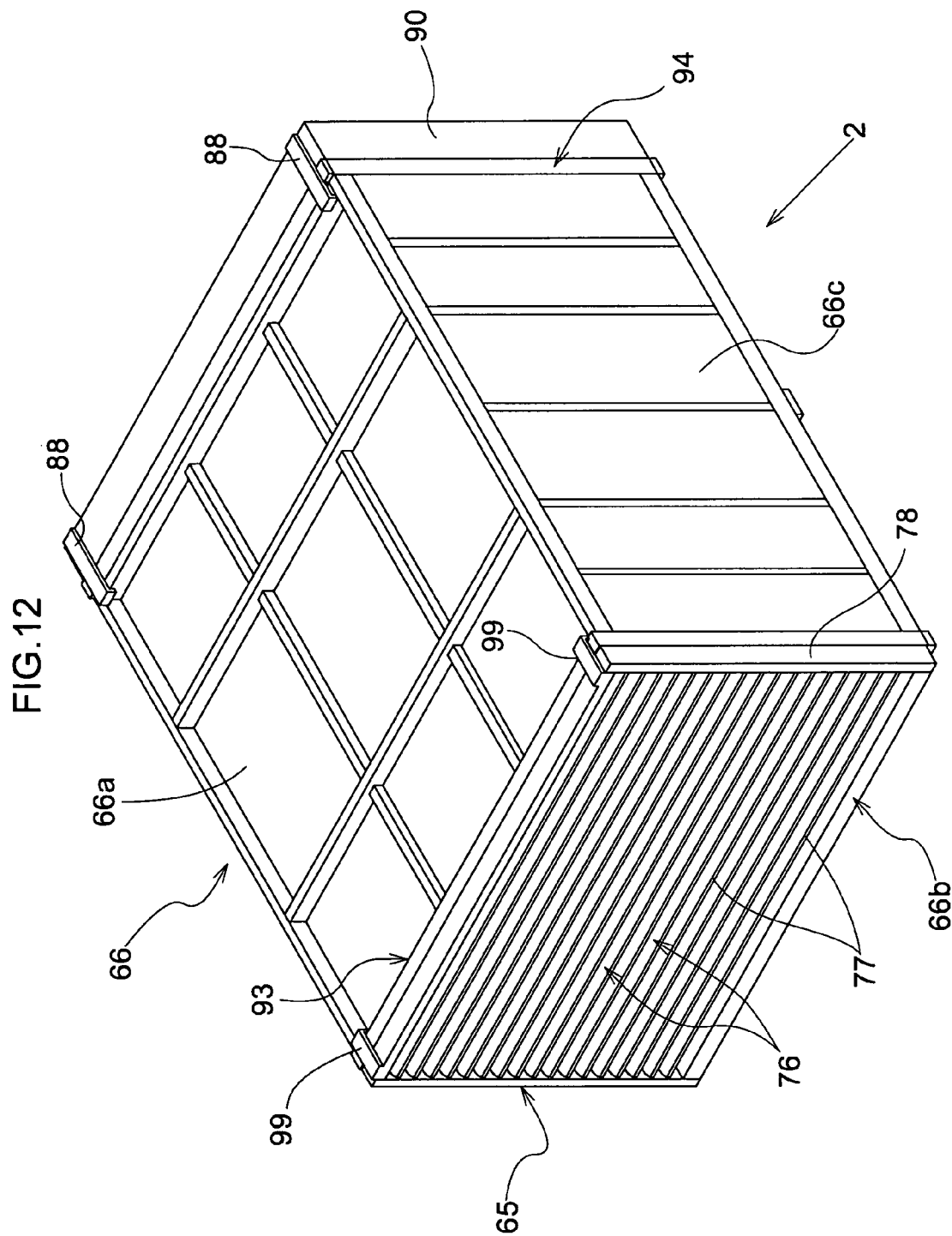
FIG. 12 is a perspective view of the container of the first embodiment.

As shown in FIGS. 11 and 12, the container 2 is formed in a quadrangular tube shape turned over sideways. An opening on one end side of the container 2 (first opening) serves as the entrance 72 used for loading and unloading the substrate 1, the fan filter unit 64 that performs ventilation from an opening on the other end side of the container 2 (second opening) toward the entrance 72 is provided at the an opening portion on the other end side of the container 2 (namely, area of the second opening), and the lid 65 that opens and closes the entrance 72 of the container 2 is provided at the entrance portion of the container 2 such that the lid 65 partially opens in a closed state, and also allows transfer of the substrate 1 by the substrate transfer device 7 in an open state.

In other words, an opening at one end side of a container main unit 66 formed in a quadrangular tube shape turned over sideways is configured as the entrance 72 for loading and unloading the substrates 1 one at a time, the fan filter unit 64 that performs ventilation from an opening on the other end side of the container main unit 66 toward the entrance 72 is provided at an opening portion on the other end side of the container main unit 66, and the lid 65 that opens and closes the entrance 72 of the container main body 66, is provided at the entrance portion of the container main unit 66 such that the lid 65 partially opens as a ventilation opening 75 in a closed state, and also allows transfer of the substrate 1 by the substrate transfer device 7 in an open state.

Figure 10:
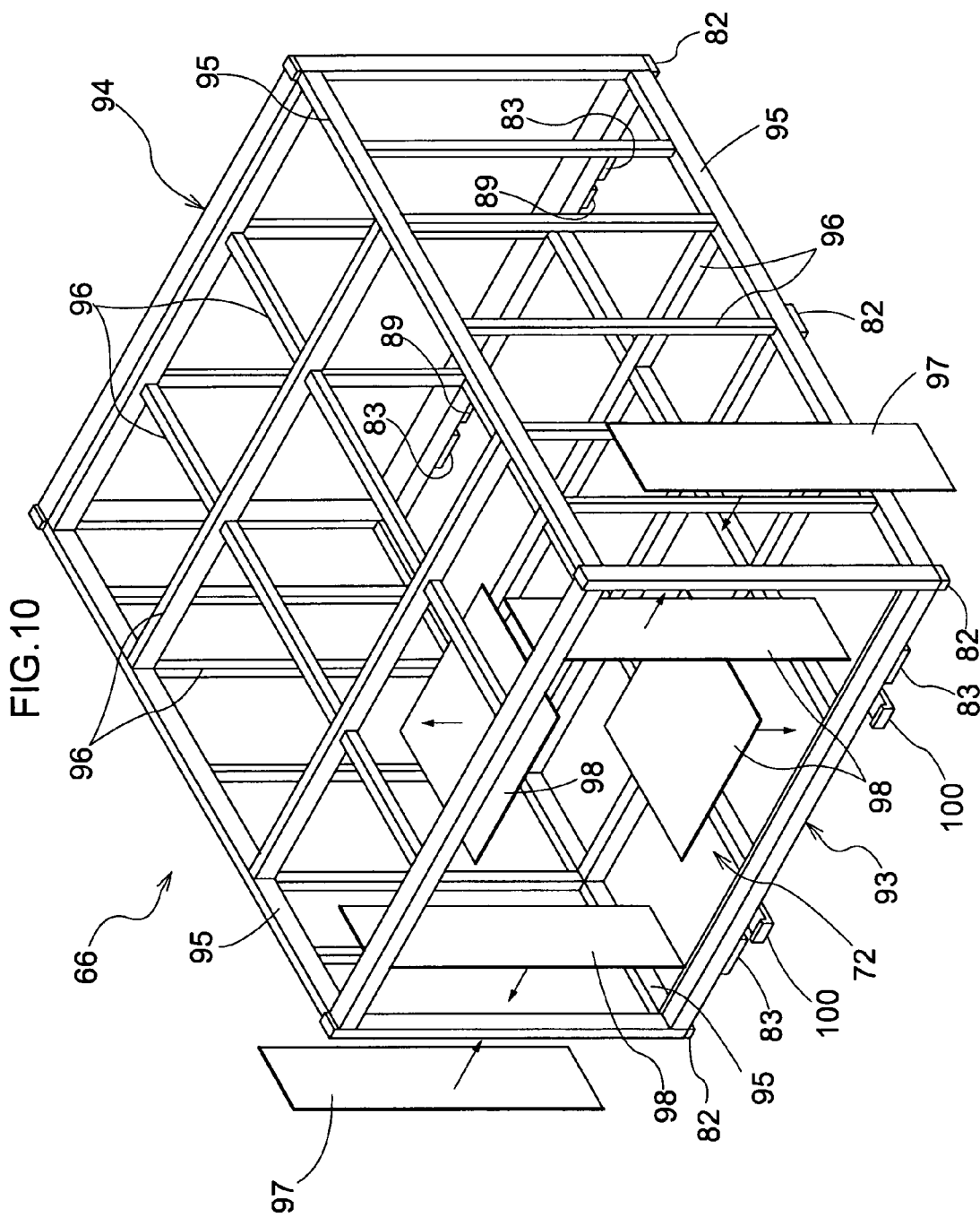
FIG. 10 is an exploded perspective view of a container main unit of the first embodiment.

As shown in FIG. 10, the container main unit 66 is formed as a lattice-like frame using a one end side rectangular frame 93 having a rectangular shape that forms an opening on one end side of the container main unit 66, an other end side rectangular frame 94 having a rectangular shape as well that forms an opening on the other end side of the container main unit 66, corner frame members 95 that connects the one end side rectangular frame 93 and the other end side rectangular frame 94 at their respective corners, connecting frame members 96 appropriately bridging the other end side portion, right and left side portions, top and bottom portions other than the one end side portion of the container main unit 66. In both side portions, exterior surface members 97 provided so as to cover the opening formed in both side portions and form the same plane with the rectangular frame and frame members on the exterior surface side, and interior surface members 98 provided so as to form the same plane with the rectangular frame and frame members on the interior surface side are provided. In the top and bottom portions, the interior surface members 98 are provided so as to cover the openings formed in both of the top and bottom portions. In this manner, the container main unit 66 is formed in a quadrangular tube shape turned over sideways. As shown in FIG. 11, the container main unit 66 includes an upper wall 66a, a bottom wall 66b and right and left side walls 66c.

Then, in the one end side rectangular frame 93, the other end side rectangular frame 94 and the lower frame members 95, support sections for storage 82 are provided, at which the container main unit 66 is mounted and supported when stored in the storage section 4 of the storage shelf 5. In the one end side rectangular frame 93 and the other end side rectangular frame 94, support sections for transfer 83 are provided, at which the container main unit 66 is mounted and supported when transferred by the container transfer device 8 such as the stacker crane 10.

Figure 13:
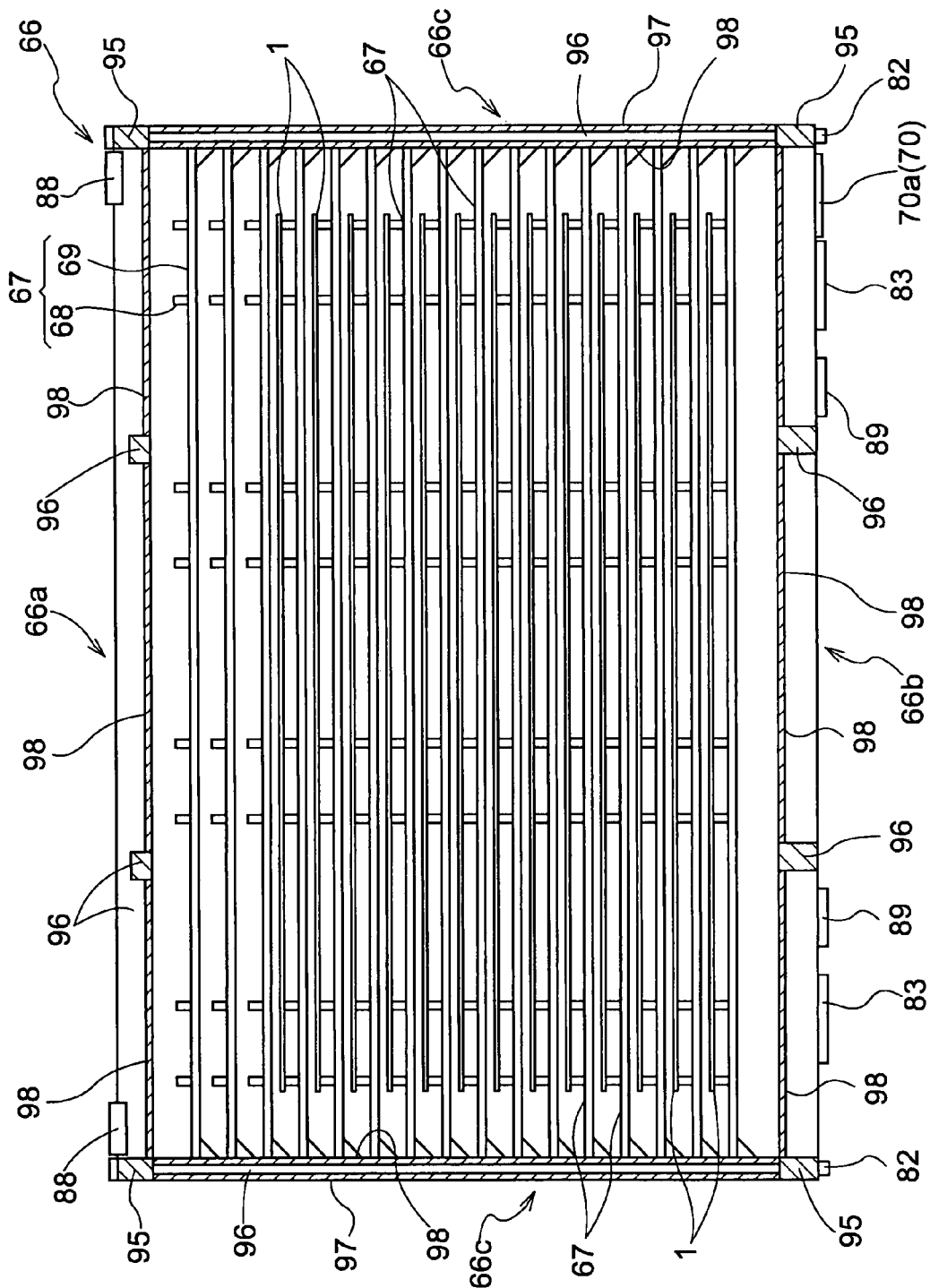
FIG. 13 is a vertical cross-sectional view of the container of the first embodiment when viewed from the front.

As shown in FIGS. 13 and 17, in the container main unit 66, support members 67 bridge the right and left side walls 66c. A plurality of support members 67 are provided lined up in the front-and-rear direction to support a single substrate 1, and also arranged in plural vertical levels at set intervals such that the number of levels corresponds to the number of substrates 1 stored in the container 2.

As shown in FIG. 13, each support member 67 includes a main unit frame 69 bridging the connecting frame members 96 at the right and left side walls 66c of the container main unit 66, and a plurality of pin members 68 provided erect thereon. The pin members 68 are provided erect at the set positions on the main unit frame 69 so as not to interfere with the support section 59 of the substrate transfer robot 55 while the substrate transfer robot 55 loads and unloads the substrate 1 to and from the container 2. By supporting the substrate 1 with a plurality of pin members 68, a gap is formed between the main unit frame 69 and the substrate 1 supported by the pin members 68, where the support section 59 of the substrate transport robot 55 is inserted.

As shown in FIG. 11, three fan filter units 64 are provided on the container main unit 66, and these three fan filter units 64 are attached to the FFU frame unit 90, which is joined to the opening portion of the other end side of the container main unit 66 so as to be supported, lined up in the longitudinal width direction of the FFU frame unit 90.

The FFU frame unit 90 is provided with the power receiving section 70a of a non-contact power supply device 70, and the three fan filter units 64 are operated with power supplied by a power supply section 70b (see FIG. 2) of the non-contact power supply device 70, which is provided supported by the mount and support section 32 in each storage section 4.

The FFU frame unit 90 also includes the battery 71 that stores power supplied to the power receiving section 70a. In the case in which a supply of power to the container 2 is stopped as a result of the power receiving section 70a being separated from the power supply section 70b, such as when the container 2 is transferred by the stacker crane 10, power stored in the battery 71 is used to operate the three fan filter units 64.

Next, the lid 65 is described.

Figure 16:
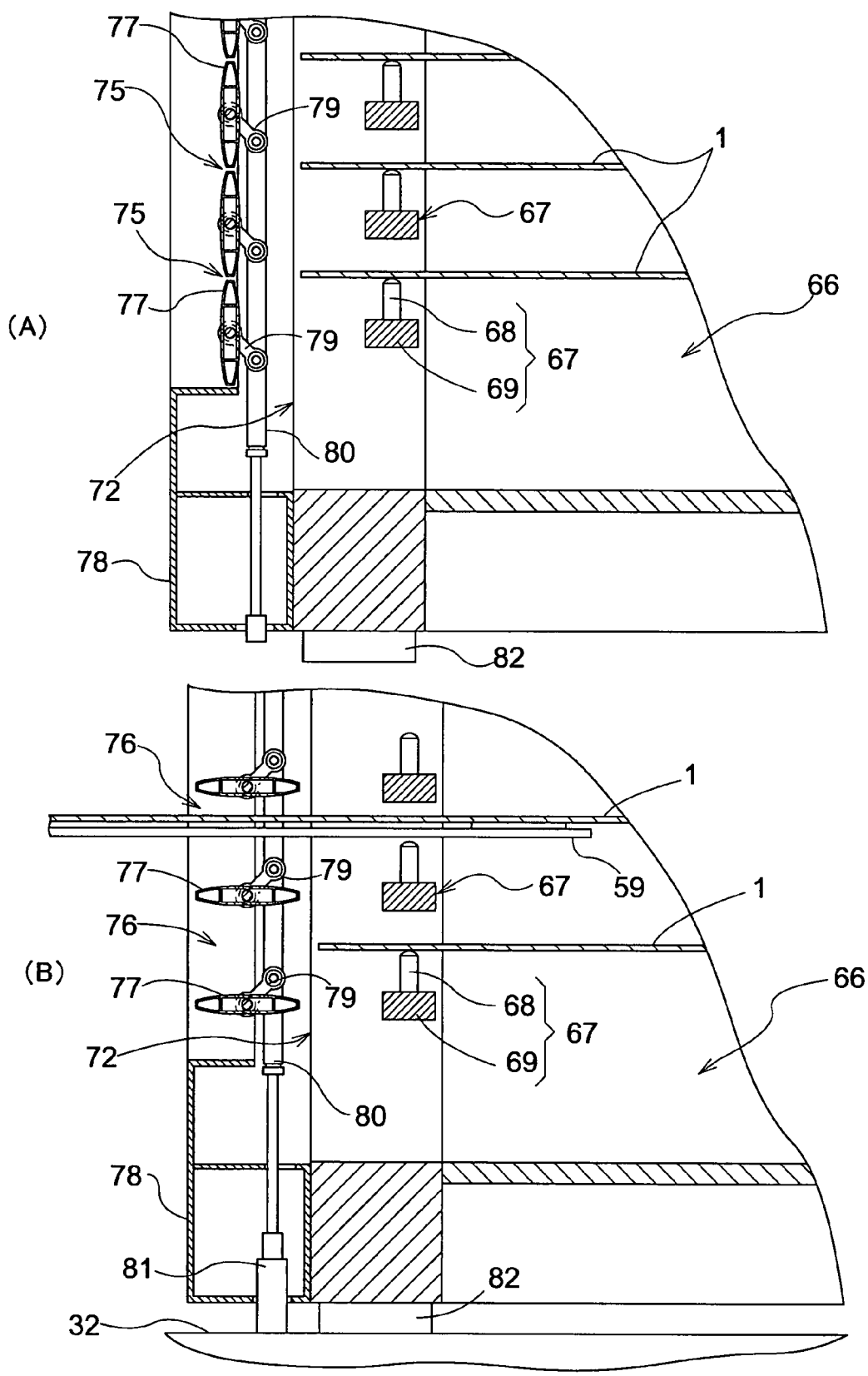
FIG. 16 is a side view illustrating closed and open states of the lid of the first embodiment.

As shown in FIG. 16, the ventilation opening 75 in the lid 65 is formed in a slit shape extending horizontally over substantially the same length as the lateral width direction of the entrance 72, and a plurality of ventilation openings 75 are formed arranged vertically such that each ventilation opening 75 corresponds to each of a plurality of substrates 1 held in the container main unit 66.

As shown in FIG. 16B, the lid 65 is configured so as to open the entrance 72 such that substrate loading/unloading openings 76, which is formed in a slit shape extending horizontally over substantially the same length as the lateral width direction of the entrance 72, are formed at the positions corresponding to a plurality of substrates 1 held in the container main unit 66, and also that the access to the adjacent substrate loading/unloading openings 76 is prevented, in an open state in which loading and unloading of the substrate 1 is allowed.

Further description is provided for the lid 65. As shown in FIG. 16, the lid 65 is formed by vertically arranging a plurality of lid forming members 77 having substantially the same longitudinal width as the entrance 72, and is configured so as to open the entrance 72 such that the bent holes 75 are formed between the adjacent lid forming members 77 in a closed state, and also that the substrate loading/unloading openings 76 are formed between the adjacent lid forming members 77 in an open state, which is achieved by rotating the lid forming members 77 around the axis disposed along the lateral width direction of the entrance 72.

Each of a plurality of the lid forming members 77 is constituted by a plate-like member formed in a hollow thin plate shape when viewed from the side, and supported by a lid frame unit 78 at the center portion thereof so as to be freely rotating around the horizontal axis. The lid 65, as shown in FIG. 16A, becomes a closed state in which a comparatively small opening formed between adjacent lid forming members 77 serves as the ventilation opening 75, as a result of rotating a plurality of lid forming members 77 around the horizontal axis so as to be in a position along the vertical direction. Also, the lid 65 becomes, as shown FIG. 16B, an open state in which a comparatively large opening formed between adjacent lid forming members 77 serves as the substrate loading/unloading opening 76, as a result of rotating a plurality of lid forming members 77 around the horizontal axis so as to be in a position along the front-and-rear direction.

That is, as shown in FIGS. 16A and 17A, when the lid 65 is in a closed state, the ventilation openings 75 are open between a plurality of lid forming members 77, and therefore clean air can be passed with the fan filter unit 64 from the opening on the other end side of the container 2 toward the entrance 72 to be discharged from the ventilation openings 75 in the entrance 72. Since the ventilation openings 75 are formed as small openings with a plurality of lid forming members 77 in a position along the vertical direction (direction that intersects the airflow direction), the speed of clean air discharged from the ventilation openings 75 is fast, and thus it is possible to prevent entry of outside air into the container 2 from the entrance 72 of the container 2.

As shown in FIGS. 16B and 17B, when the lid 65 is in an open state, the substrate loading/unloading openings 76, which is larger than the ventilation opening 75, are open between a plurality of lid forming members 77, and therefore the substrate 1 can be loaded and unloaded through the substrate loading/unloading opening 76. The speed of clean air discharged from the substrate loading/unloading opening 76 is fast, although not as fast as that in a closed state, as a result of the airflow path being narrowed due to a plurality of lid forming members 77 in a position along the front-and-rear direction (airflow direction), and thus it is possible to prevent entry of outside air into the container 2 from the entrance 72 of the container 2.

Also, between the adjacent lid forming members 77, the ventilation opening 75 is formed in a closed state and the substrate loading/unloading opening 76 is formed in an open state, as described above. A plurality of lid forming member 77 do not contact each other in open and closed states of the lid 65, or while the lid 65 is switched into these states. Therefore, no dust is caused by the lid forming members 77 contacting each other, and occurrence of dust from the lid 65 can be prevented.

The lid 65 is biased so as to return to a closed state. A connecting rod 80 as an operation section that puts the lid 65 in an open state due to upward motion thereof is provided extending downward from the bottom face portion of the container main unit 66.

Further description is provided below. As shown in FIG. 16A, a base end portion of a link member 79 is connected to each of the lid forming members 77 in a position along the vertical direction, in a state in which the link member 79 extends downward behind the lid forming member 77, such that the link member 79 and the lid forming member 77 can rotate in an integrated manner, and a free end portion of each link member 79 is connected to the connecting rod 80 that extends vertically so as to be capable of freely rotating. As a result of moving the connecting rod 80 upward in a closed state in which the lid forming members 77 are in a position along the vertical direction, an open state is achieved in which the lid forming members 77 are in a position along the front-and-rear direction. Also, by moving the connecting rod 80 downward in an open state in which the lid forming members 77 are in a position along the front-and-rear direction, a closed state is achieved in which the lid forming members 77 are in a position along the vertical direction.

The connecting rod 80 is biased downward by its own weight. The lid 65 is in a closed state when the connecting rod 80 protrudes downward from the bottom face portion of the container main unit 66. In this state, when the container 2 is mounted on the substrate loading/unloading section 6, a lid projection section 81 provided in the mount and support section 32 of the substrate loading/unloading section 6 pushes the connecting rod 80 upward, the lid forming members 77 are rotated via the link members 79 and put in a position along the front-and-rear direction, thereby putting the lid 65 in an open state. It should be noted that by lifting the container 2 from the substrate loading/unloading section 6, the connecting rod 80 is pushed downward by its own weight. Then, the lid forming members 77 are rotated via the link members 79 and put in a position along the vertical direction, thereby putting the lid 65 in a closed state. Downward motion of the connecting rod 80 is restricted by a restricting member (not shown) such that the downward motion stops at a state in which a lower end portion of the connecting rod 80 protrudes downward from the bottom face portion of the container main unit 66.

The portion that pushes the connecting rod 80 upward, such as the lid projection section 81 of the substrate loading/unloading section 6, is not provided in the storage sections 4 other than those serving as the substrate loading/unloading section 6, or the container transfer device 8 such as the stacker crane 10, so that the connecting rod 80 is pushed upward only when the container 2 is positioned in the substrate loading/unloading section 6. In this manner, the lid 65 of the container 2 maintains a closed state when the container 2 is stored in the storage section 4 other than those serving as the substrate loading/unloading section 6, or is transferred by the stacker crane 10 or the like.

That is, in the substrate processing facility, when the container 2 is stored in the storage shelf 5, or transferred by the container transfer device 8, purity of the substrate 1 is maintained by performing ventilation with the fan filter units 64 with the lid 65 of the container 2 in a closed state. When the substrate 1 is transferred by the substrate transfer device 7 in the substrate loading/unloading section 6, purity of the substrate transfer area 24 is maintained by the fan filter units 64 performing ventilation with the lid 65 of the container 2 in an open state, and also with the clean air ventilation means for transfer area 25. In this manner, the substrate processing method capable of maintaining purity of the substrate 1 is provided.

Then, the container 2 includes a controller 109 that controls operations of three fan filter units 64 in order to increase the ventilation flow rate thereof when the lid 65 is in an open state.

Figure 18:
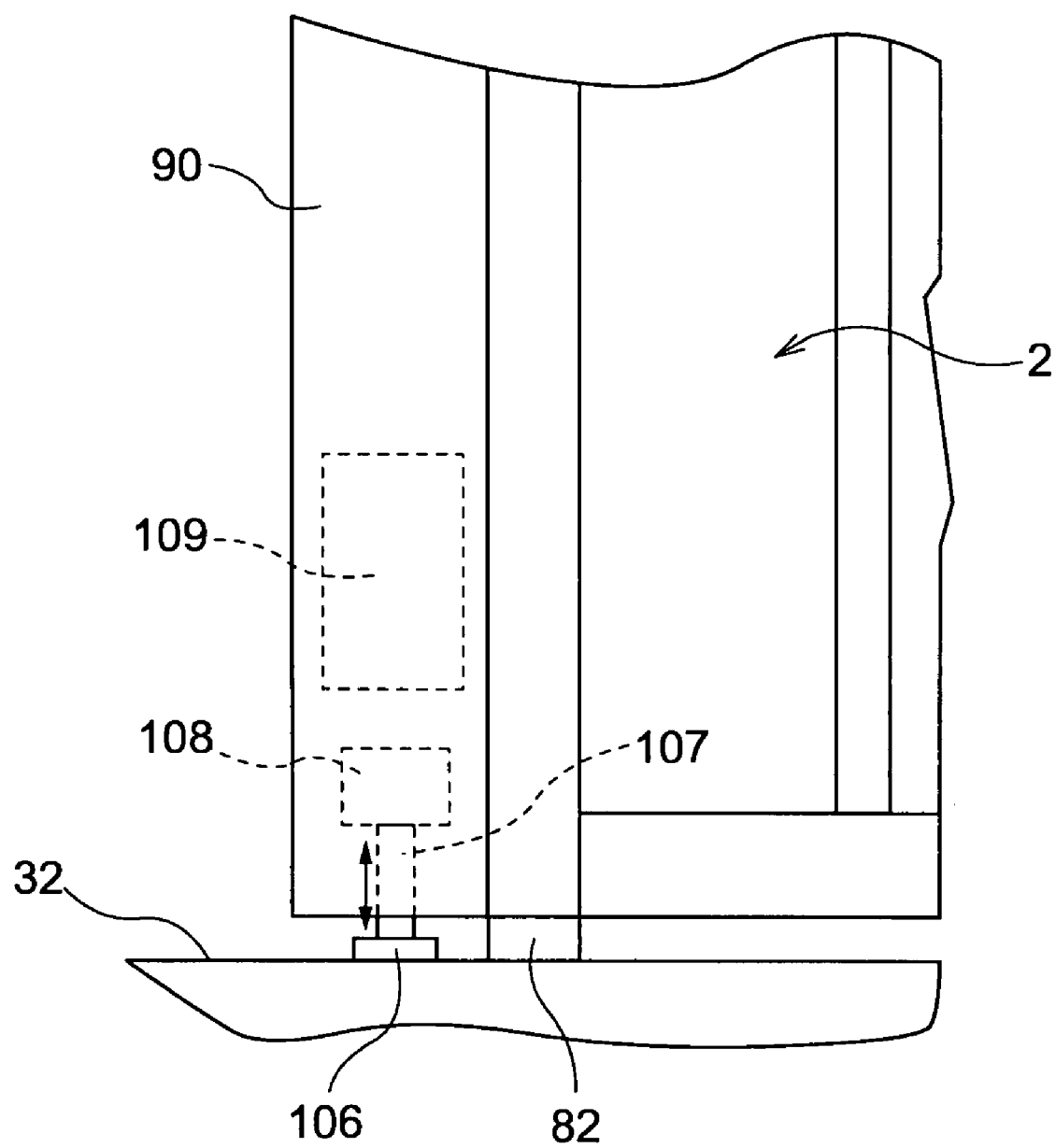
FIG. 18 is a side view illustrating a controller of the fan filter unit of the first embodiment.

That is, as shown in FIGS. 11 and 18, the FFR frame unit 90 includes a detection piece 107 capable of ascending/descending motion, which ascends as a result of being pushed upward by an FFU projection section 106 provided in the mount and support section 32 of the substrate loading/unloading section 6 when the container 2 is mounted on the substrate loading/unloading section 6, and descends by its own weight when the container 2 is lifted up from the substrate loading/unloading section 6, a detection switch 108 including a limit switch that detects the ascending/descending motion of the detection piece 107 and sends the detected information to the controller 109, and the controller 109 that controls operations of the fan filter units 64 based on the detected information from the detection switch 108. The controller 109 controls operations of the fan filter units 64 based on the detected information from the detection switch 108, so as to increase the ventilation flow rate of the fan filter units 64 when the detection piece 107 is in an ascended state, and decrease the ventilation flow rate of the fan filter units 64 when the detection piece 107 is in a descended state.

The FFU projection section 106 is not provided in the storage sections 4 other than those serving as the substrate loading/unloading section 6, or the container transfer device 8 such as the stacker crane 10, as the lid projection section 81.

Accordingly, the ventilation flow rate of the fan filter units 64 increases when the container 2 is positioned in the substrate loading/unloading section 6 and the lid 65 is in an open state, and the ventilation flow rate of the fan filter units 64 decreases when the container 2 is not positioned in the substrate loading/unloading section 6 and the lid 65 is in a closed state.

It is preferable to prevent the substrate 1 in the container 2 from being soiled by dust caused by the lid 65 when the lid 65 is switched to an open state or a closed state, by increasing the ventilation flow rate of the fan filter units 64 at a time point before the lid 65 is switched to an open state, and decreasing the ventilation flow rate at a time point after the lid 65 is switched to a closed state. Such a relation between the switching of the lid 65 to an open state and a closed state, and increase and decrease in the ventilation flow rate of the fan filter units 64 can be achieved by adjusting the height of the lid projection section 81 and the FFU projection section 106.

As shown in FIG. 11, the fan filter units 64 and the lid 65 are detachably attached to the container main unit 66. The fan filter units 64 and the lid 65 can be removed from the container 2 such that the container 2 can be washed easily.

Figure 14:
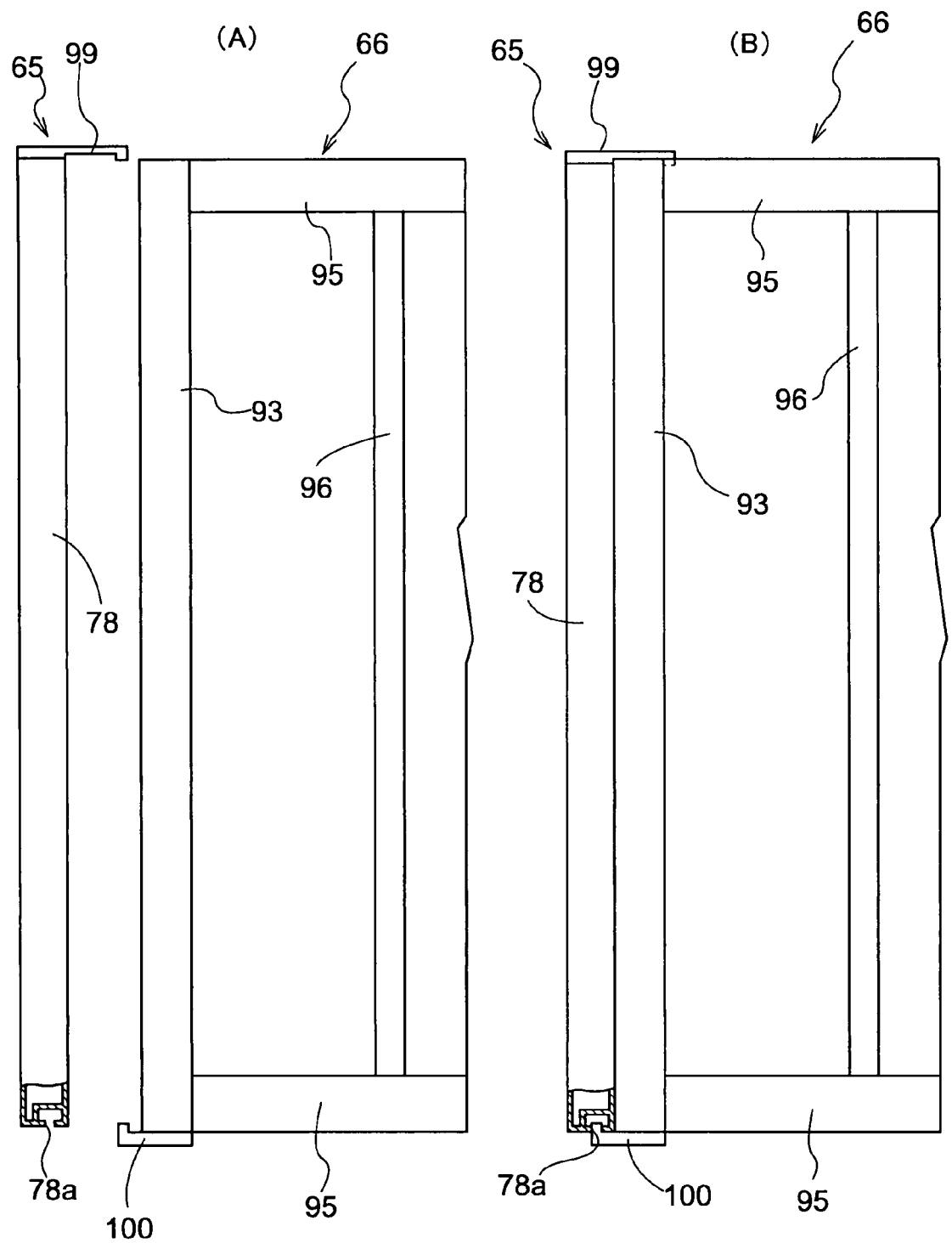
FIG. 14 is a side view illustrating attaching/detaching of a lid of the first embodiment.

Specifically, as shown in FIG. 14, at the upper end portion of the lid frame unit 78 is provided a lid engagement member 99 that engages with an upper portion of the one end side rectangular frame 93 of the container main unit 66 from above. At a lower end portion of the one end side rectangular frame 93, a lid engagement support plate 100 is provided that engages with an engaged groove 78a that is formed at the lower end portion of the lid frame unit 78 so as to mount and support the lid frame unit 78. The lid 65 can be attached and detached with respect to the container main unit 66 by engaging and disengaging the lid engagement member 99 with an upper portion of the one end side rectangular frame 93, and engaging and disengaging the lid engagement support plate 100 with the engaged groove 78a of the lid frame unit 78.

Figure 15:
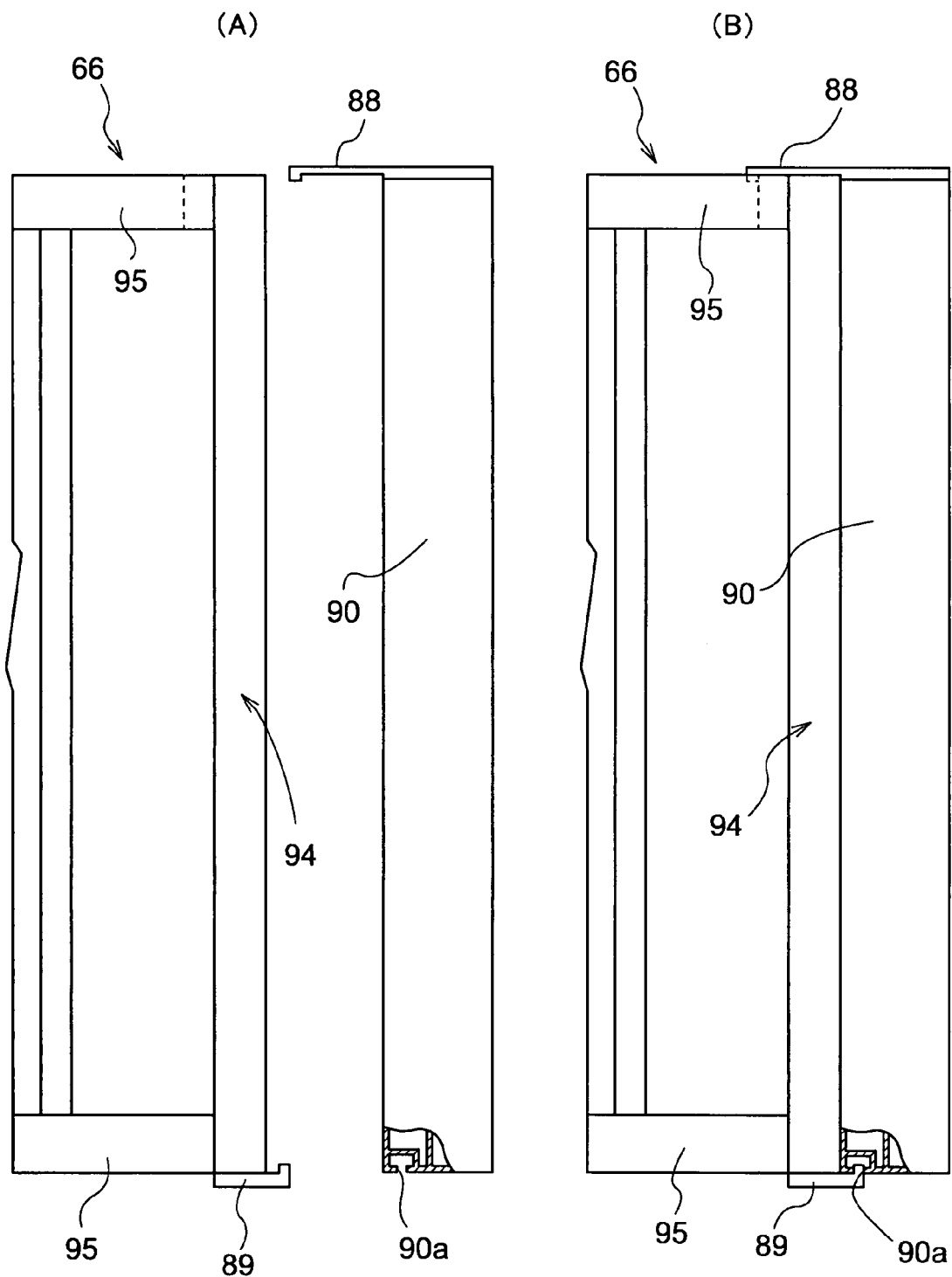
FIG. 15 is a side view illustrating attaching/detaching of a fan filter unit of the first embodiment.

In addition, as shown in FIG. 15, at an upper end portion of the FFU frame unit 90, an FFU engagement member 88 is provided that engages with an upper portion of the other end side rectangular frame 94 of the container main unit 66 from above. At a lower end portion of the other end side rectangular frame 94, an FFU engagement support plate 89 is provided that engages with an engaged groove 90a that is formed at a lower end portion of the FFU frame unit 90 so as to support and mount the FFU frame unit 90. The fan filter units 64 can be attached and detached with respect to the container main unit 66 along with the power supply section 70b and the battery 71, by engaging and disengaging the FFU engagement member 88 with an upper portion of the other end side rectangular frame 94, and engaging and disengaging the FFU engagement support plate 89 with the engaged groove 90a of the FFU frame unit 90.

As shown FIG. 2, part of a plurality of storage sections 4 at the lowest level provided in the storage shelf 5 serve as the loading/unloading section 9 for cart where the container 2 can be loaded and unloaded with a cart 85 through the rear face side of the storage shelf 5. After the container 2 is unloaded through the loading/unloading section 9 for cart using the cart 85, the fan filter units 64 and the lid 65 can be removed from the container 2, so that the container 2 can be washed using a container washing device 86. At the rear face side of the loading/unloading section 9 for cart, a shutter 84 that closes the rear face side of the loading/unloading section 9 is provided. The control means H controls operations of the stacker crane 10 such that the stacker crane 10 does not transfer the container 2 to the loading/unloading section 9 for cart while the shutter 84 is open.

Second Embodiment

This second embodiment is a modified example of the first embodiment, in which the structure for supporting the container 2 in the substrate loading/unloading section 6 and the structure for opening and closing the lid 65 of the container 2 are modified. In the following, the second embodiment of the structure for supporting the container 2 in the substrate loading/unloading section 6 and the structure for opening and closing the lid 65 of the container 2 is described. It should be noted that components configured in a similar manner to those in the first embodiment are assigned the same reference numerals as in the first embodiment, and description thereof is omitted.

Firstly, the structure for supporting the container 2 in the substrate loading/unloading section 6 is described.

Figure 23:
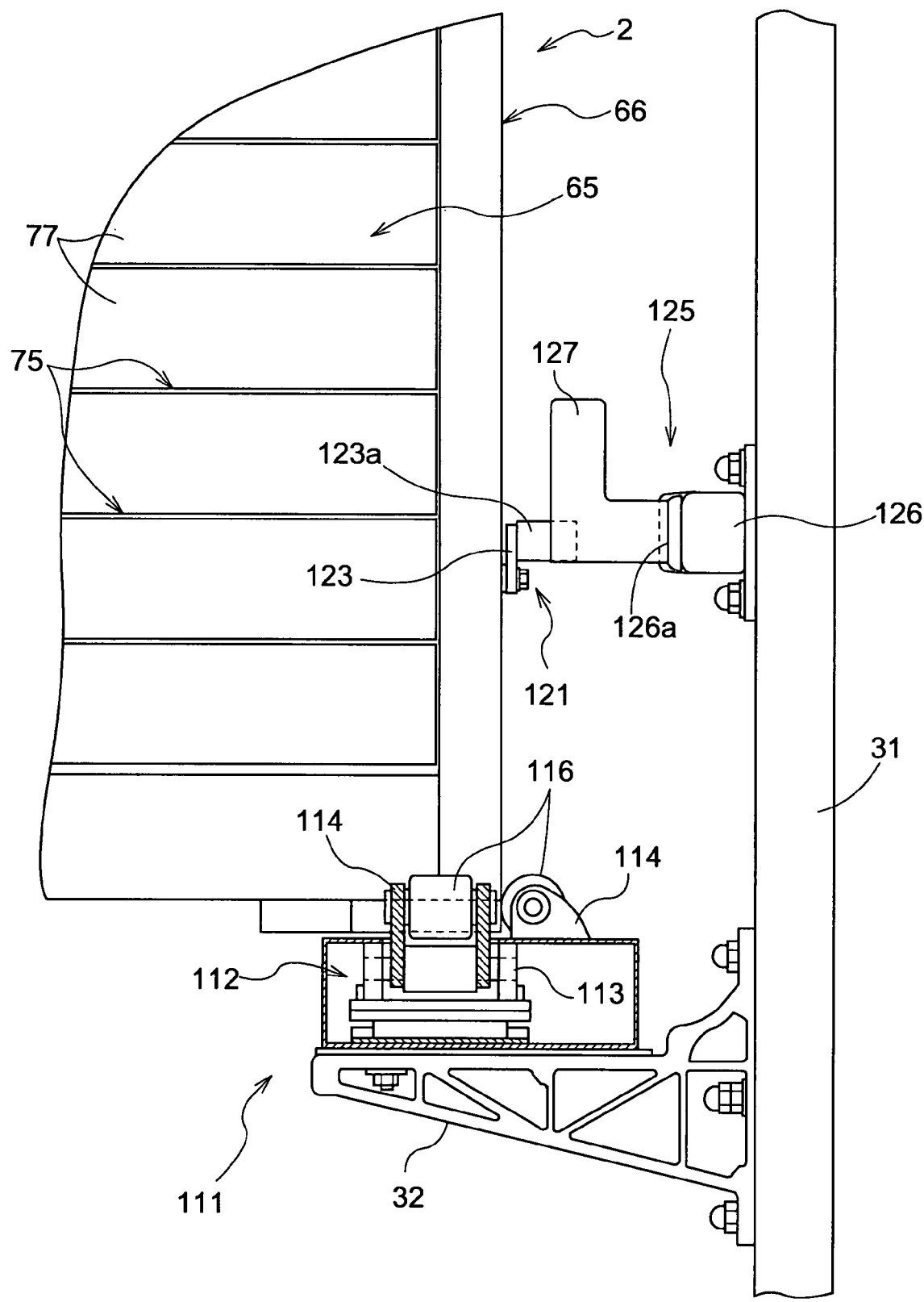
FIG. 23 is a front view illustrating a centering device and a lid operation means of a second embodiment.

As shown in FIGS. 23 and 24, at the mount and support section 32 in the substrate loading/unloading section 6, a centering device 111 is provided that moves the container 2 to a correct position when the container 2 mounted on the substrate loading/unloading section 6 is displaced from the correct position in the horizontal direction.

The centering device 111 includes a plurality of support and operation mechanisms 112 that support the container 2 and also push the side face of the container 2. When the supported container 2 is displaced from the correct position in the horizontal direction, the support and operation mechanism 112 disposed on the displaced side pushes the side face of the container 2 so as to move the container 2 to the correct position.

As shown in FIG. 24, each of a plurality of support and operation mechanisms 112 is configured such that a swinging member 114 is supported on a base 113 disposed on the mount and support section 32 so as to be capable of freely swinging, and the swinging member 114 includes a container support roller 115 that mounts and supports the container 2, a push operation roller 116 that pushes the side face of the container 2, and a swing regulating roller 117 that regulates swing of the swinging member 114.

The support and operation mechanism 112 is further described below. The swinging member 114 includes a horizontal portion and a vertical portion that protrudes in an expanding manner toward the side away from the horizontal portion, and is L-shaped when viewed from the side. The base end portion of the horizontal portion of the swinging member 114 is supported by the base 113 so as to be capable of freely swinging. The container support roller 115 is supported at a distal end portion of the horizontal portion of the swinging member 114 so as to be capable of freely rotating, the push operation roller 116 is supported at a distal end portion of the vertical portion of the swinging member 114 so as to be capable of freely rotating, and the swing regulating roller 117 is supported at a vertex portion of a portion that protrudes in an expanding manner of the vertical portion of the swinging member 114.

Each support and operation mechanism 112 is configured such that swing of the swinging member 114 from a standby position toward the side opposite a support position is regulated by the swing regulating roller 117 abutting the base 113 (see FIG. 24A), and swing of the swinging member 114 from the support position toward the side opposite the standby position is regulated by the container support roller 115 abutting the base 113 (see FIG. 24B), and therefore the swinging member 114 swings and shifts its position between the standby position and the support position.

Also, in each support and operation mechanism 112, the swinging member 114 is biased toward the standby position by the push operation roller 116, the swing regulating roller 117 and the like, and therefore the swinging member 114 is in the standby position when the container 2 is not supported, and when the container 2 is mounted on the container support roller 115, the swinging member 114 shifts its position from the standby position to the support position due to the weight of the container 2. As the swinging member 114 shifts its position from the standby position to the support position, the push operation roller 116 moves toward the container 2 to push the side face of the container 2.

A total of eight support and operation mechanisms 112 are provided, two for each of four sides of the bottom face portion of the container 2, which is formed in a rectangular shape when viewed from the top.

Next, the structure for opening and closing the lid 65 of the container 2 is described.

As shown in FIG. 23, an operation section 121 that moves in the face direction of the side face portion of the container main unit 66 (namely, direction parallel to the side face) to put the lid 65 in an open state is provided such that it projects laterally from the side face portion of the container main unit 66.

Figure 25:
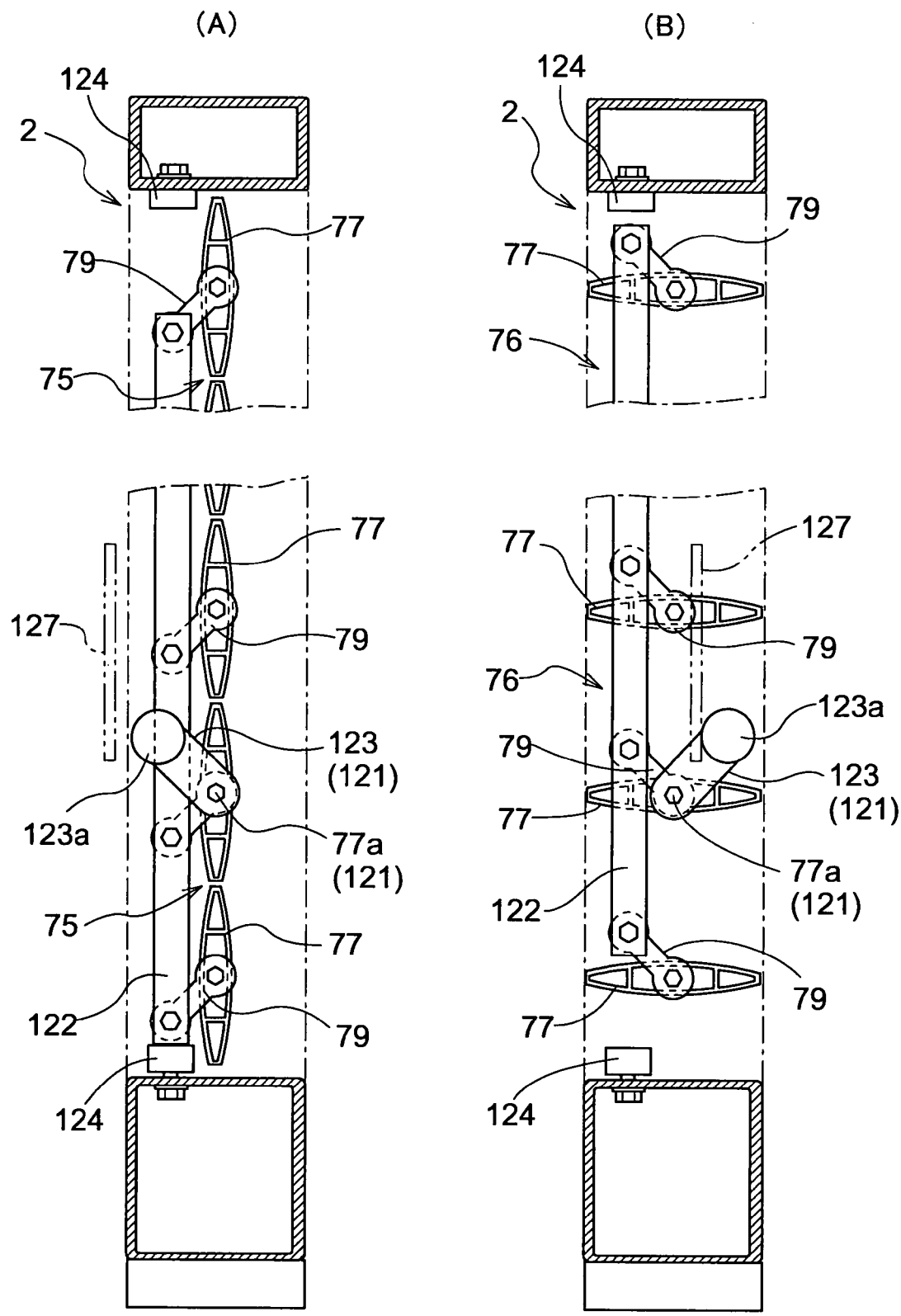
FIG. 25 is a vertical cross-sectional view of the lid of the second embodiment when viewed from the side.
Figure 26:
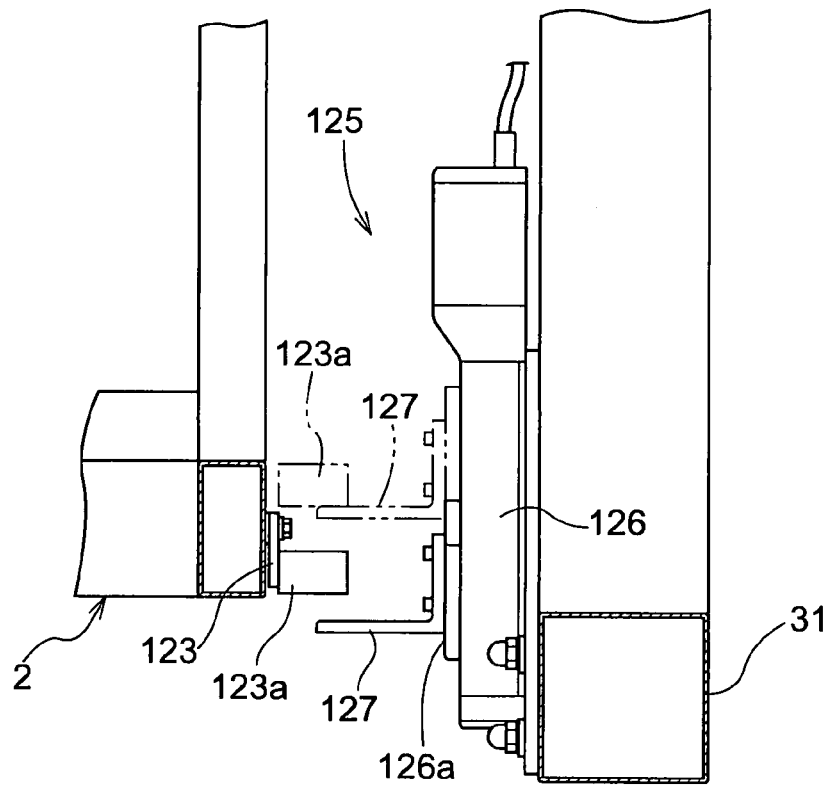
FIG. 26 is a plan view illustrating the lid operating means of the second embodiment.

Further description is provided below. As shown in FIG. 25, one of a plurality of lid forming members 77 is provided with an operation rotation shaft 77*a*, both end portions of which laterally project from the side face portions of the container main unit 66. At each of the end portions of the operation rotation shaft 77*a* that laterally project from the side face portions of the container main unit 66, an operation lever 123 is connected in a state it extends upward in front of the lid forming member 77 in a position along the vertical direction, such that the operational lever 123 and the lid forming member 77 can rotate in an integrated manner. These operation rotation shaft 77*a* and operational lever 123 constitute the operation section 121.

The base end side of the link member 79 is connected to each of the lid forming members 77 in a position along the vertical direction, in a state in which the link member 79 extends downward in front of the lid forming member 77, such that the link member 79 and the lid forming member 77 can rotate in an integrated manner, and a free end portion of each link member 79 is connected to a rod member 122 that extends in the vertical direction so as to be capable of freely rotating. Consequently, a plurality of lid forming members 77 rotate in a linked manner. As a result of the operation lever 123 swinging rearward in a closed state in which the lid forming members 77 are in a position along the vertical direction, the lid forming members 77 are put in a position along in the front-and-rear direction, thereby putting the lid 65 in an open state. Also as a result of the operation lever 123 swinging forward in an open state in which the lid forming members 77 are in a position along the front-and-rear direction, the lid forming members 77 are put in a position along the vertical direction, thereby putting the lid 65 in a closed state.

The operation lever 123 can freely swing between a closed position in which the lid 65 is in a closed state, and an open position in which the lid 65 is in an open state. Swing from the closed position to the side opposite the open position is regulated by the rod member 122 abutting a lower regulating member 124, and swing from the open position to the side opposite the closed position is regulated by the rod member 122 abutting an upper regulating member 124. The operation lever 123 is biased toward the closed position due to the weight of the rod member 122.

As shown in FIGS. 23 to 26, in one of the columns 31 arranged on the right and left sides of the substrate loading/unloading section 6, a lid operation means 125 that operates the operation lever 123 in the front-and-rear direction is provided. The lid operation means 125 is provided so as to correspond to at least one of a pair of right and left operation levers 123, and operates one of the pair of operation levers 123 so as to switch the lid 65 into an open state and a closed state. In the present embodiment, the lid operation means 125 is not provided in the other of the columns 31 arranged on the right and left sides of the substrate loading/unloading section 6. The other of the pair of operation levers 123 is used when the operator manually switches the lid 65 into an open state and a closed state.

The lid operation means 125 includes an electric cylinder 126 provided with a moving member 126*a* that slides in the front-and-rear direction, and an operation member 127 provided erect on the moving member 126*a*. As a result of the operation member 127 being moved to the rear side with the electric cylinder 126, the operation member 127 pushes the operated portion 123*a* of the operation lever 123 so as to achieve the open position in which the operation lever 123 is swung to the rear side. As a result of the operation member 127 being moved to the front side with the electric cylinder 126, the operation lever 123 is swung to the front side due to biasing force so as to achieve the closed position.

The lid operation means 125 switches the lid 65 to an open state as a result of the container 2 moving to the front side when the container 2 is loaded into the substrate loading/unloading section 6 with the article transfer device 38, and to a closed state as a result of the container 2 moving to the rear side when the container 2 is unloaded from the substrate loading/unloading section 6 with the article transfer device 38, in a state in which the operation member 127 has been moved to the rear side with the electric cylinder 126.

Further description is provided below. The operation member 127 of the lid operation means 125 is L-shaped when viewed from the front, and the vertical portion along the vertical direction of the operation member 127 is formed elongated in the vertical direction, as shown in FIGS. 27B and 28B, such that it covers from the height at which the operated portion 123*a* of the operation lever 123 in the closed position is positioned when the container 2 is transferred in the front-and-rear direction with the article transfer device 38, to the height at which the operated portion 123*a* of the operation lever 123 in the closed position is positioned when the container 2 is mounted and supported by the mount and support section 32.

Then, since the vertical portion of the operation member 127 is formed elongated in the vertical direction as described above, the lid operation means 125 can switch the lid 65 of the container 2 into an open state and a closed state by moving the operation member 127 to the front and rear sides with respect to the container 2 that is transferred in the front-and-rear direction with the article transfer device 38.

Even if the operation member 127 is moved to the rear side due to malfunction of the lid operation means 125 while the container 2 is loaded to and unloaded from the substrate loading/unloading section 6, the lid 65 can be switched to an open state by the operation member 127 by making use of motion of the container 2 caused by the article transfer device 38.

Figure 27:
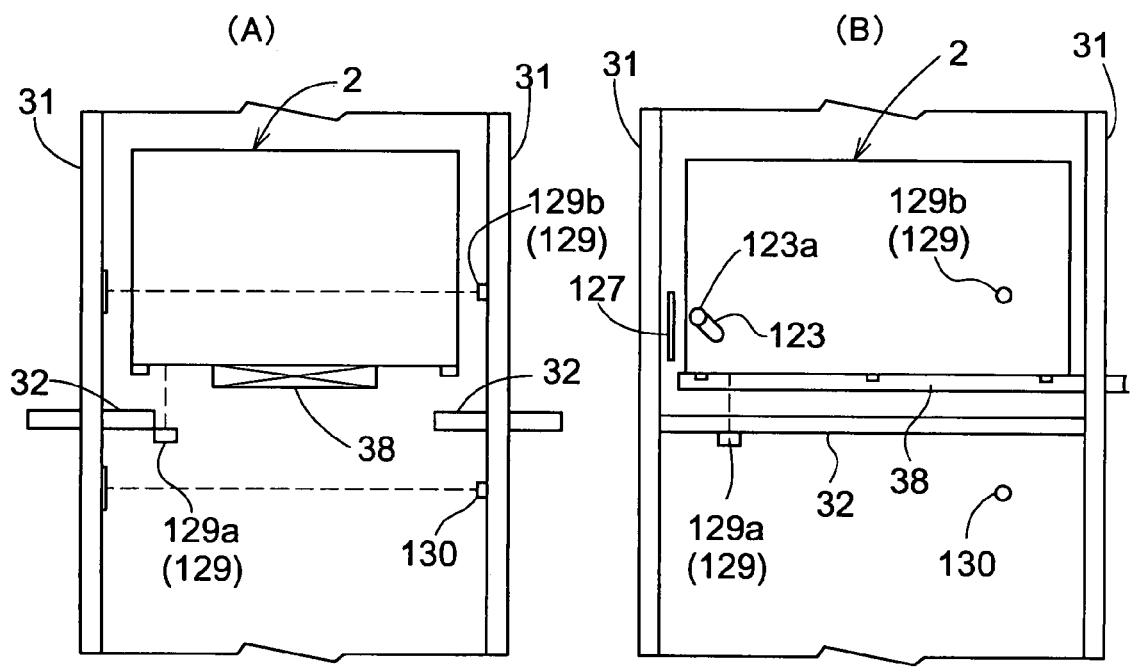
FIG. 27 is an operation diagram during loading/unloading of the container of the second embodiment.
Figure 28:
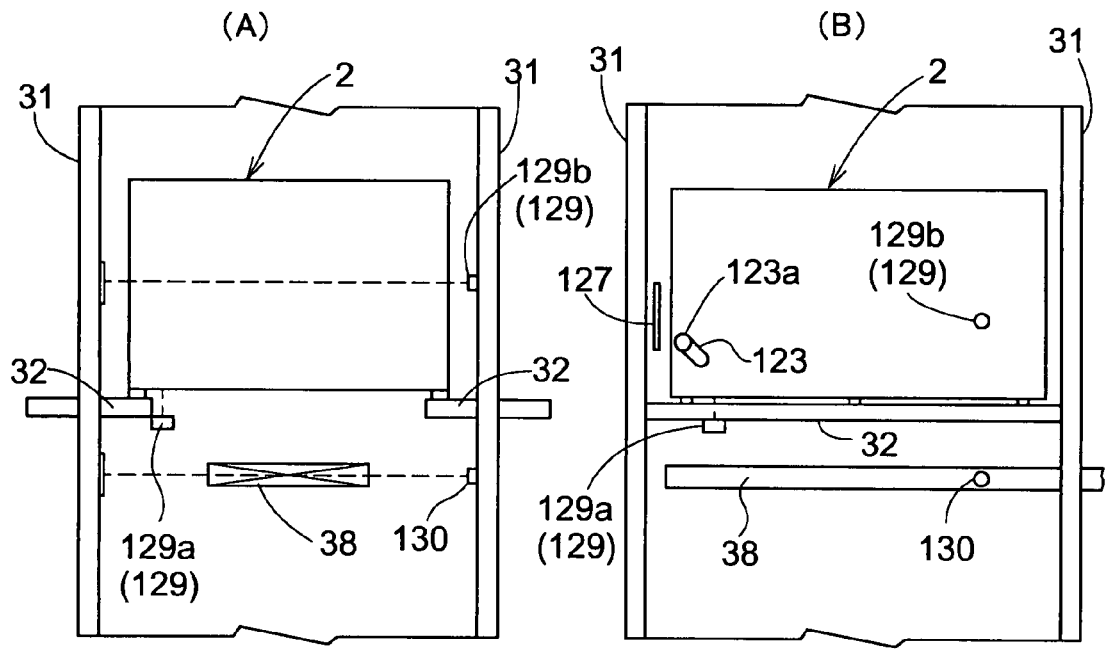
FIG. 28 is an operation diagram during loading/unloading of the container of the second embodiment.
Figure 29:
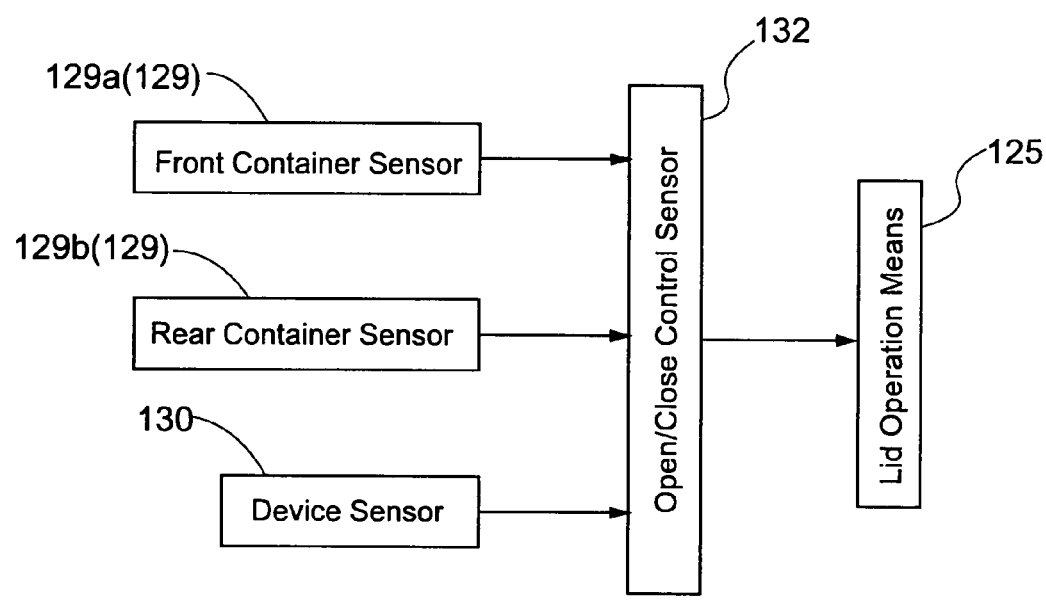
FIG. 29 is a control block diagram of the second embodiment.

As shown in FIGS. 27 to 29, the substrate processing facility includes a container presence sensor 129 that detects presence of the container 2 in the substrate loading/unloading section 6, a device presence sensor 130 that detects presence of the article transfer device 38 below the substrate loading/unloading section 6, the lid operation means 125 that opens and closes the lid 65, and an open/close control means 132 that controls operations of the lid operation means 125 such that the lid 65 is opened after the container 2 is mounted on the mount and support section 32 with the article transfer device 38, and the lid 65 is closed before the container 2 is scooped up from the mount and support section 32 with the article transport device 38, based on the detection results from the container presence sensor 129 and the device presence sensor 130.

Each of the container presence sensor 129 and the device presence sensor 130 is constituted by a photoelectric sensor, and a front-side container presence sensor 129*a* provided in a front portion of the substrate loading/unloading section 6, and a rear-side container presence sensor 129*b* provided in a rear portion of the substrate loading/unloading section 6 are provided as the container presence sensor 129.

As shown in FIGS. 27 and 28, the front-side container presence sensor 129a is configured as a ranging sensor, which has a light emitting section that emits light in an upward direction at a lower front portion of the substrate loading/ unloading section 6, and a light receiving section that receives light that has been emitted from the light emitting section and reflected on the container 2 at a lower front portion of the substrate loading/unloading section 6. When the container 2 is mounted on and supported by the mount and support section 32 or the container 2 has been moved downward close to the mount and support section 32, and the front-side container presence sensor 129a detects that the distance to the container 2 is shorter than a predetermined distance (that is, the container is mounted on and supported by the mount and support section, or located close to the mount and support section; hereinafter referred to as "detection state"), the open/close control means 132 judges that the container 2 is present in the substrate loading/unloading section 6.

The rear-side container presence sensor 129b has a reflection plate on one side of the substrate loading/unloading section 6, and also has a light emitting section that emits light horizontally and a light receiving section that receives light that has been emitted from the light emitting section and reflected on the reflection plate on the other side of the substrate loading/unloading section 6. When the rear-side container presence sensor 129b becomes the detection state as a result of the emitted light being blocked by the container 2, the open/close control means 132 judges that the container 2 is present above the mount and support section 32.

The device presence sensor 130 has a reflection plate on one side of the substrate loading/unloading section 6, and also has a light emitting section that emits light horizontally and a light receiving section that receives light that has been emitted from the light emitting section and reflected on the reflection plate on the other side of the substrate loading/unloading section 6. When the device presence sensor 130 becomes the detection state as a result of the emitted light being blocked by the article transfer device 38, the open/close control means 132 judges that the article transfer device 38 is present below the mount and support section 32.

That is, when the container 2 is loaded into the substrate loading/unloading section 6, the article transfer device 38 that is positioned higher than the mount and support section 32 with the container 2 mounted thereon is projected toward the substrate loading/unloading section 6, then is moved downward to a position lower than the mount and support section 32 for supporting the container 2 so that the container 2 is supported by the mount and support section 32, and is retracted toward the stacker crane 10 with the container 2 being no longer mounted thereon. When the article transfer device 38 with the container 2 mounted thereon is projected toward the substrate loading/unloading section 6, the rearside container presence sensor 129b becomes the detection state of detecting the container 2, and when the article transfer device 38 is moved downward to a position lower than the mount and support section 32 that supports the container 2, the device presence sensor 130 becomes the detection state of detecting the article transfer device 38 after the front-side container presence sensor 129a has become the detection state of detecting the container 2. In this manner, when the device presence sensor 130 becomes the detection state after both of the front-side and rear-side container presence sensors 129 have become the detection state, the open/close control means 132 judges that the container 2 has been loaded into the substrate loading/unloading section 6, and controls operations of the lid operation means 125 so as to open the lid 65.

Then, when the article transfer device 38 that no longer mounts the container 2 thereon is retracted toward the stacker crane 10, the device presence sensor 130 becomes a non-detection state in which the article transfer device 38 is not detected.

Alternatively, when the container 2 is unloaded from the substrate loading/unloading section 6, the article transfer device 38 that is positioned lower than the mount and support section 32 and does not mount the container 2 thereon is projected toward the substrate loading/unloading section 6, then is moved upward to a position higher than the mount and support section 32 so as to scoop up the container 2, and is retracted toward the stacker crane 10 with the container 2 mounted thereon. When the article transfer device 38 that is positioned lower than the mount and support section 32 is projected toward the substrate loading/unloading section 6, the device presence sensor 130 becomes the detection state of detecting the article transfer device 38, and the open/close control means 132 judges that the container 2 is to be unloaded from the substrate loading/unloading section 6 and controls operations of the lid operation means 125 so as to close the lid 65.

Then, when the article transfer device 38 is moved upward to a position higher than the mount and support section 32, after the device presence sensor 130 becomes a non-detection state in which the article transfer device 38 is not detected, the front-side container presence sensor 129a becomes the non-detection state in which the container 2 is not detected. Then, when the article transfer device 38 with the container 2 mounted thereon is retracted toward the stacker crane 10, the rear-side container presence sensor 129b becomes the non-detection state in which the container 2 is not detected.

Other Embodiments (1) In the above embodiment, although each of a plurality of lid forming members 77 is constituted by a plate-like member that is formed in a plate shape when viewed from the side, each lid forming member 77 may be constituted by a lid member main unit that is formed in a plate shape when viewed from the side, and a lid ancillary portion provided erect on the lid member main unit.

Figure 20:
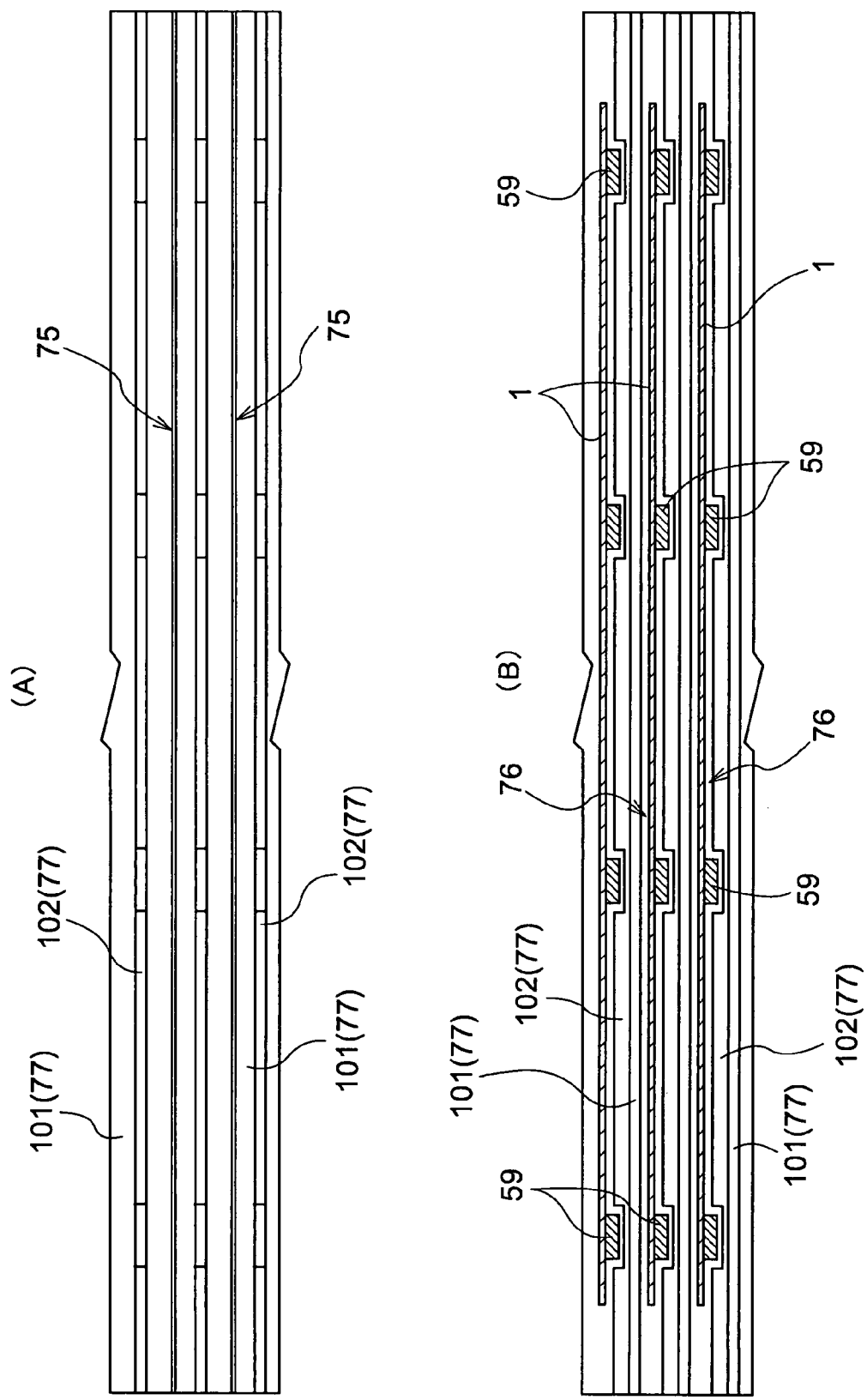
FIG. 20 is a front view illustrating closed and open states of the lid of another embodiment.

Specifically, as shown in FIGS. 19 and 20, each of a plurality of lid forming members 77 may be formed T-shaped when viewed from the side, by forming a lid member main unit 101 and a lid ancillary member 102 integrally such that the lid ancillary member 102 is provided erect vertically on the top face of the lid member main unit 101, which is formed in a plate shape when viewed from the side and is in a position along the front-and-rear direction. In such a case, as shown in FIG. 20B, the lid ancillary member 102 of the lid forming member 77 may be formed in a concavo-convex shape when viewed from the front, such that, in an open state, the lid ancillary member 102 of a certain lid forming member 77 closes an opening formed between the lid member main unit 101 of that lid forming member 77 and that of the lid forming member 77 adjacent thereto on the upper side, except spaces for loading and unloading the substrate 1 and inserting and retracting the support section 59 of the substrate transfer robot 55, in other words, so as to have a height that is low enough to allow loading and unloading of the substrate 1 and insertion and retraction of the support section 59 at portions that correspond to insertion and retraction of the support section 59, and a height that is high enough to allow only loading and unloading of the substrate 1 at portions that do not correspond to insertion and retraction of the support section 59.

Also, each of a plurality of lid forming members 77 may be formed to be cross-shaped when viewed from the side, by forming the lid member main unit 101 and the lid ancillary member 102 integrally by providing the lid ancillary members 102 erect vertically on the top and bottom faces of the lid member main unit 101, which is formed in a plate shape when viewed from the side and is in a position along the front-and-rear direction.

(2) In the above embodiment, although each of a plurality of lid forming members 77 is constituted by a plate member that is formed in a plate shape when viewed from the side, each lid forming member 77 may be constituted by a lid member main unit that is formed in a plate shape when viewed from the side and a lid ancillary member which is separate from the lid member main unit.

Figure 22:
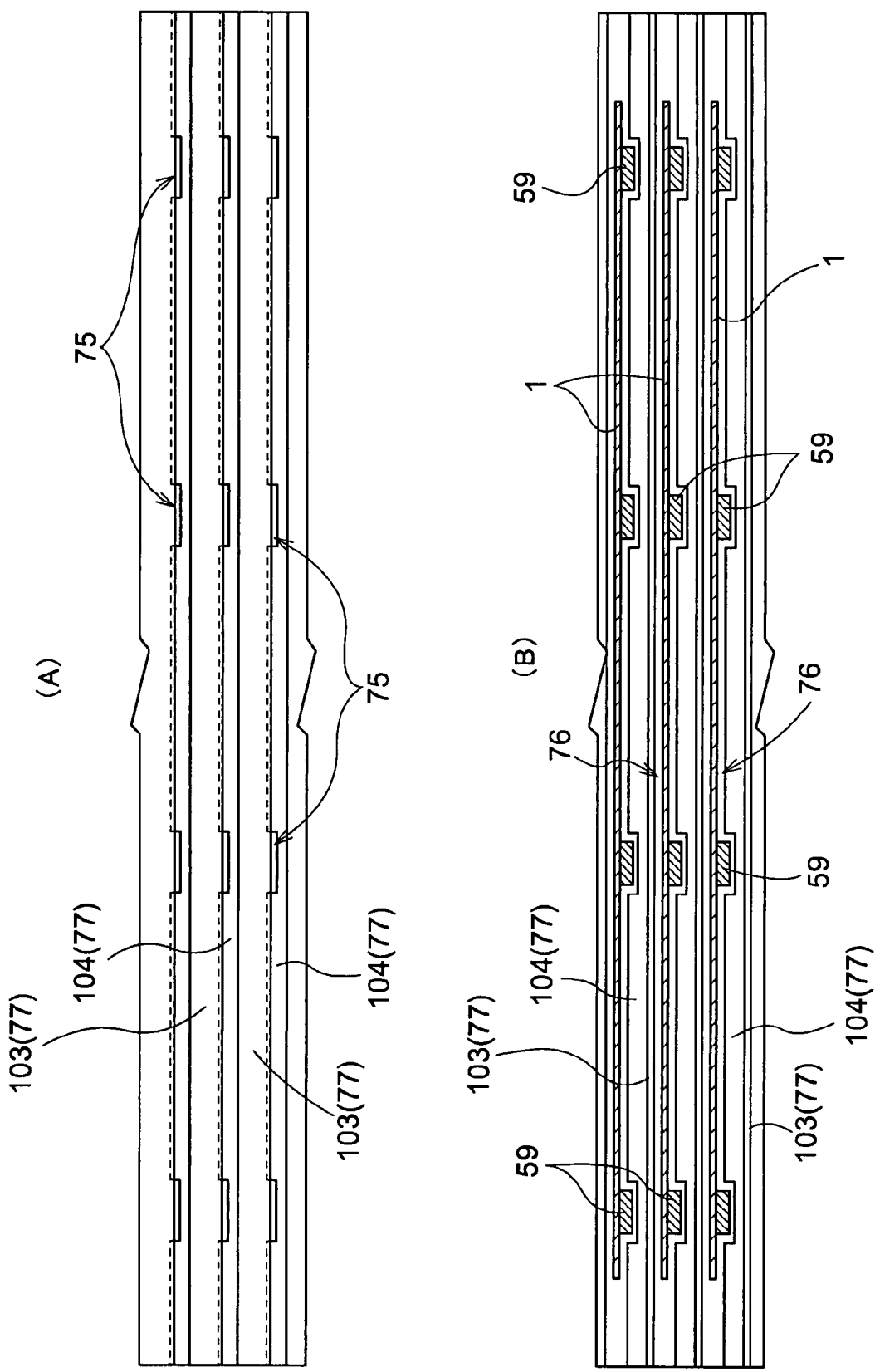
FIG. 22 is a front view illustrating closed and open states of the lid of another embodiment.

Specifically, as shown in FIGS. 21 and 22, each of a plurality of lid forming members 77 may be constituted by a lid member main unit 103 that is supported so as to be capable of freely rotating around a horizontal axis located in the upper end portion of the lid frame member 78, and a lid ancillary member 104 that is supported fixed to the lid frame member 78. In this case, as shown in FIG. 21, a configuration is possible in which the lid ancillary member 104 of the lid forming member 77 is disposed between adjacent substrate loading/unloading openings 76 so as to close a space between the adjacent substrate loading/unloading openings 76, and as shown in FIG. 22B, is formed in a concavo-convex shape when viewed from the front, such that, in an open state, a certain lid member main unit 103 of the lid forming member 77 closes an opening formed between the lid ancillary member 104 of that lid member main unit 103 and the lid ancillary member 104 of the lid member main unit 103 adjacent thereto on the upper side, except spaces for loading and unloading the substrate 1 and inserting and retracting the support section 59 of the substrate transfer robot 55, in other words, so as to have a height that is low enough to allow loading and unloading of the substrate 1 and insertion and retraction of the support section 59 at portions that correspond to insertion and retraction of the support section 59, and a height that is high enough to allow only loading and unloading of the substrate 1 at portions that do not correspond to insertion and retraction of the support section 59, and also, the lid member main unit 103 of a certain lid forming member 77 is formed to have a length such that the upper end portion thereof overlaps the lower end portion of the lid ancillary member 104 of the lid forming member 77 adjacent thereto on the upper side, and also in the closed state, the lower end portion thereof overlaps the upper portion of, and does not overlap the lower portion of, the lid ancillary member 104 of that lid forming member 77.

In the above embodiment, each of a plurality of lid forming members 77 may be supported by the lid frame unit 78 so as to be capable of freely rotating around the horizontal axis located in an upper end or a lower end portion thereof.

Also, each of a plurality of lid forming members 77 may be constituted by a lid member main unit supported so as to capable of freely sliding in the vertical direction and a lid ancillary member supported in a fixed manner. In such a case, for example, a configuration is possible in which in an open state in which the lid member main unit and the lid ancillary member are overlapped in the front-and-rear direction, the lid member main unit and the lid ancillary member are formed in a concavo-convex shape when viewed from the front, as the above-described lid ancillary member 104, and a closed state is achieved by sliding the lid member main unit so as to make the range in which the lid member main unit and the lid ancillary member overlap narrower.

(3) In the above embodiment, although the substrate loading/unloading openings 76 are formed in the same number as that of substrates 1 held in the container 2, the number of the substrate loading/unloading openings 76 formed may be smaller than the number of the substrates 1 held in the container 2. For example, it is possible that one lid forming member 77 is provided for two substrates 1, and two substrates 1 are loaded and unloaded through a single substrate loading/unloading opening 76. Alternatively, the lid 65 may have a shutter structure with which the lid 65 is switched to an open state by sliding the shutter to the upper side of the container main unit 66 from a closed state, or the lid 65 may be provided with a door, such that a single substrate loading/unloading openings 76 is formed in an open state, through which all substrates 1 are loaded/unloaded. When the lid 65 is provided with a single door as described above, it is conceived to perform switching between a closed state and an open state by swinging the door around a side end portion thereof or attaching/detaching the door.

Also in the above embodiment, although the ventilation opening 75 is formed in a slit shape that extends horizontally over substantially the same length as the lateral width direction of the entrance 72, the ventilation opening 75 may be formed in a slit that extends vertically, or in any other shapes such as circle.

(4) In the first embodiment, the operation section 80 is provided such that it projects downward from the bottom face portion of the container main unit 66. However, the operation section 80 may be provided such that it does not project downward from the bottom face portion of the container main unit 66. In such a case, for example, in the above embodiments, the operation section 80 can be pushed upward by increasing the height of the lid projection section 81.

Also, although the lid projection section 81 for pushing upward the operation section 80 is provided in the substrate loading/unloading section 6, the lid projection section 81 for pushing upward the operation section 80 may not be provided in the substrate loading/unloading section 6.

In other words, a configuration is possible in which the operation member 80 and a plurality of lid forming members 77 are interlocked such that when the operation section 80 greatly projects downward from the bottom face portion of the container main unit 66, the lid forming members 77 are in a position along the vertical direction, and when the operation section 80 hardly projects or does not project at all downward from the bottom face portion of the container main unit 66, the lid forming members 77 are in a position along the front-and-rear direction, and when the container 2 is mounted on a flat mount surface of the substrate loading/unloading section 6, the operation section 80 is pushed upward by the mount surface.

Also in the first embodiment, although the lid 65 is switched between an open state and a closed state by moving the operation section 80 in the vertical direction, the lid 65 may be switched between an open state and a closed state by moving the operation section 80 in the longitudinal width direction or the front-and-rear direction.

(5) In the first embodiment, the operation section 80 is operated so as to switch the lid 65 between an open state and a closed state by vertically moving the container 2 with the container transfer device 8 in the substrate loading/unloading section 6. However, a configuration is possible in which the substrate loading/unloading section 6 or the container 2 is provided with an operation means for operating the operation section 80, and the lid 65 is switched between an open state and a closed state by operating the operation section 80 with the operation means after the container 2 is mounted on the mount place.

Also in the first embodiment, although the lid 65 is biased to return to a closed state by its own weight, a biasing means such as a spring may be used for biasing the lid 65 to return to a closed state. Alternatively, the lid 65 may be configured so as not to be biased to return to a closed state, and the lid 65 may be switched to a closed state by operating the above-described operation means.

(6) In the first embodiment, although the operation section 80 and a plurality of lid forming members 77 are interlocked with the link members 79, the operation section 80 and a plurality of lid forming members 77 may be interlocked with a rack and pinions.

Specifically, it is possible that a rack is formed in the operation section 80 and each lid forming member 77 is provided with a pinion that engages with the rack, and the pinion that engages with the rack is rotationally driven in accordance with the ascending/descending motion of the operation section 80, so that each lid forming member 77 is switched to the position along the front-and-rear direction or the position along the vertical direction.

(7) In the above embodiments, the fan filter units 64 and the lid 65 are detachably attached to the container main unit 66. However, one or both of the fan filter units 64 and the lid 65 are provided in the container main unit 66 in a fixed manner.

(8) In the above embodiment, when the substrate 1 is transferred by the substrate transfer device 7 in the substrate loading/unloading section 6, the ventilation flow rate of the fan filter units 64 of the container 2 is increased. However, it is possible that the ventilation flow rate of the fan filter units 64 is not increased even when the substrate 1 is transferred by the substrate transfer device 7 in the substrate loading/unloading section 6.

That is, the ventilation flow rate of the fan filter units 64 of the container 2 may be kept constant when the container 2 is stored in the storage shelf 5, when the container 2 is transferred by the container transfer device 8, and when the substrate 1 is transferred by the substrate transfer device 7 in the substrate loading/unloading section 6.

Also, the ventilation flow rates of the fan filter units 64 of the container 2 for when the container 2 is stored in the storage shelf 5, when the container 2 is transferred by the container transfer device 8, and when the substrate is transferred by the substrate transfer device 7 in the substrate loading/unloading section 6 may be varied. For example, the ventilation flow rate of the fan filter units 64 of the container 2 when the container 2 is transferred by the container transfer device 8 may be set larger than that when the container 2 is stored in the storage shelf 5, and the ventilation flow rate when the substrate is transferred by the substrate transfer device 7 in the substrate loading/unloading section 6 may be set larger than that when the container 2 is transferred by the container transfer device 8. Specifically, the ventilation flow rate of the fan filter units 64 of the container 2 may be increased even when the container 2 is transferred by the container transfer device 8. The ventilation flow rate when the container 2 is transferred by the container transfer device 8 may be equal to or larger than that when the substrate is transferred by the substrate transfer device 7 in the substrate loading/unloading section 6.

(9) In the above embodiment, although the storage shelves 5 are disposed on the floor portion (grating floor 14) of the clean space 13, the storage shelves 5 may be disposed on the bottom portion of the air intake chamber 16 located below the floor space.

(10) In the above embodiment, although the ceiling portion of the clean space 13 is formed by air filters, the ceiling portion of the clean space 13 may be formed by fan filter units for the ceiling portion.

(11) In the above embodiment, both side portions of the container main unit 66 have a double structure including the exterior surface members 97 and the interior surface members 98, it is possible that both side portions have a single structure including only interior surface members, as the top and bottom portions.

(12) In the above first embodiment, the base end portion of the link member 79 is connected to each of the lid forming members 77 in the position along the vertical direction, in a state in which the link member 79 extends downward behind the lid forming member 77, such that the link member 79 and the lid forming member 77 can rotate in an integrated manner, and accordingly the connecting rod 80 to which a free end portion of each link member 79 is connected so as to be capable of freely rotating is located on the rear side (side of the container main unit) from the rotation axis of the lid forming members 77. However, it is also possible that the base end portion of the link member 79 is connected to each of the lid forming members 77 in a position along the vertical direction, in a state in which the link member 79 extends downward in front of the lid forming member 77, such that the link member 79 and the lid forming member 77 can rotate in an integrated manner, and accordingly the connecting rod 80 to which a free end portion of each link member 79 is connected so as to be capable of freely rotating is located on the front side (the opposite side to the container main unit) from the rotation axis of the lid forming member 77.

(13) In the above first embodiment, the connecting rod 80 is operated as a result of moving the container 2 vertically in the substrate loading/unloading section 6 with the container transfer device 8, thereby switching the lid 65 between an open state and a closed state. However, it is also possible that a driving means such as an electric motor is provided in the lid 65 for operating the connecting rod 80, and the lid 65 is switched between an open state and a closed state as a result of operating the connecting rod 80 with the driving means.

(14) In the above embodiment, a plurality of the lid forming members 77 are configured such that all of them rotate in an integrated manner. However, it is also possible that when the lid 65 is in an open state, some of the lid forming members 77 are put in a position along the frond-and-rear direction and other lid forming members 77 are put in a position along the vertical direction, so that some lid forming members 77 are kept in a position along the vertical direction even in an open state in order to increase the speed of discharged clean air. For this purpose, a plurality of lid forming member 77 may be configured so as to be operated to rotate on an individual basis, or on a group basis of some lid forming members.

Specifically, for example, when a plurality of lid forming members 77 are operated to rotate on a group basis of some lid forming members, the following configuration is possible. An upper half of a plurality of the lid forming members 77 are connected at one end portions thereof in the longitudinal width direction to the connecting rod 80 on that one end side via the link members 79, and a lower half of a plurality of the lid forming members 77 are connected at the other end portions thereof in the longitudinal width direction to the connecting rod 80 on that other end side via the link members 79, and consequently, the upper half of the lid forming members 77 are put in a position along the front-and-rear direction through operations of the connecting rod 80 on the one end side so as to load and unload the substrate 1 in an upper half of the container 2, and the lower half of the lid forming members 77 are put in a position along the front-and-rear direction through operations of the connecting rod 80 on the other end side so as to load and unload the substrate 1 in a lower half of the container 2.

(15) In the above embodiment, the ventilation flow rate of the fan filter unit 64 is varied based on the ascending/descending motion of the detection piece 107 by the FFU projection section 106. However, the ventilation flow rate of the fan filter unit 64 may be varied based on the ascending/descending motion of the connecting rod 80 by the lid projection section 81.

Specifically, it is possible that a detection means that detects the ascending/descending motion of the connecting rod 80 and transmits detection signals to the controller 109 is provided to the lid frame unit 78, and the controller 109 controls operations of the fan filter units 64 based on the detection information from the detection means so as to increase the ventilation flow rate of the fan filter units 64 when the connecting rod 80 is in an ascended state and the lid 65 is open, and decrease the ventilation flow rate of the fan filter units 64 when the connecting rod 80 is in a descended state and the lid 65 is closed.

It should be noted that transmission of the detected information from the detection means to the controller 109 may be performed by wire, by providing in the container main unit 66 a cable connected to the lid frame unit 78 and the FFU frame unit 90 in a separable manner, or alternatively, may be performed wirelessly by providing a transmitter in the lid frame unit 78, and a receiver in the FFU frame unit 90.

(16) In the second embodiment, the operation section 121 moves along the face direction of the side face portion of the container main unit 66 so as to open the lid 65. However, the operation section 121 may move in a direction intersecting the side face portion of the container main unit 66 so as to open the lid 65.

In the second embodiment, the operation section 121 is provided such that it projects laterally from the side face portion of the container main unit 66. However, the operation section 121 may be provided such that it projects forward from the front face portion of the side wall 66c of the container main unit 66. Also in the second embodiment, the operation section 121 is provided such that the operated section 123a at the distal end thereof is located rearward from the front face portion of the side wall 66c of the container main unit 66. However, the operation section 121 may be provided such that the operated section 123a thereof is located forward from the front face portion of the side wall 66c of the container main section 66. In these cases, the operation section 121 may move in the vertical direction so as to open the lid 65.

Figure 31:
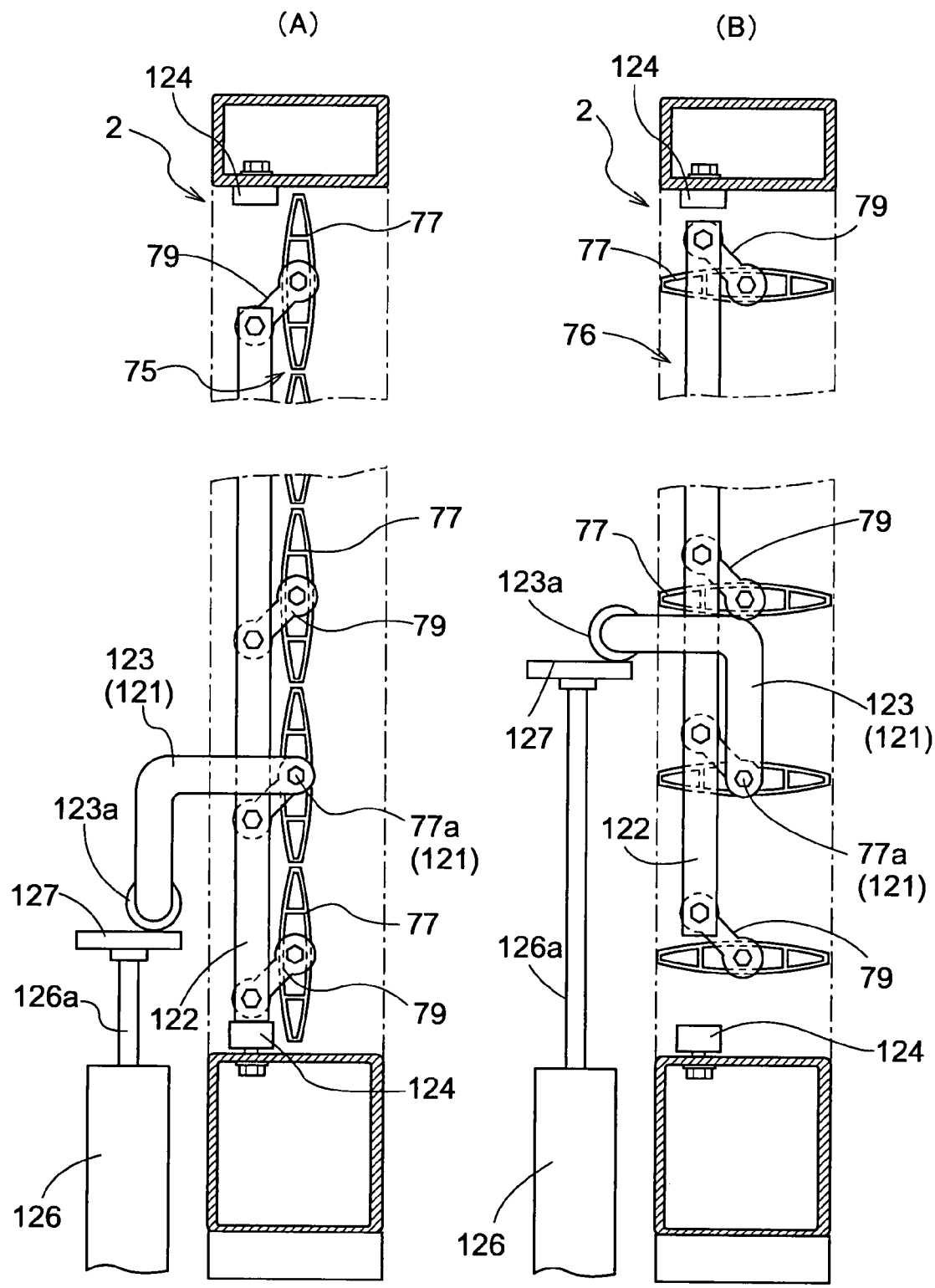
FIG. 31 is a vertical cross-sectional view of the lid of another embodiment when viewed from the side.
Figure 32:
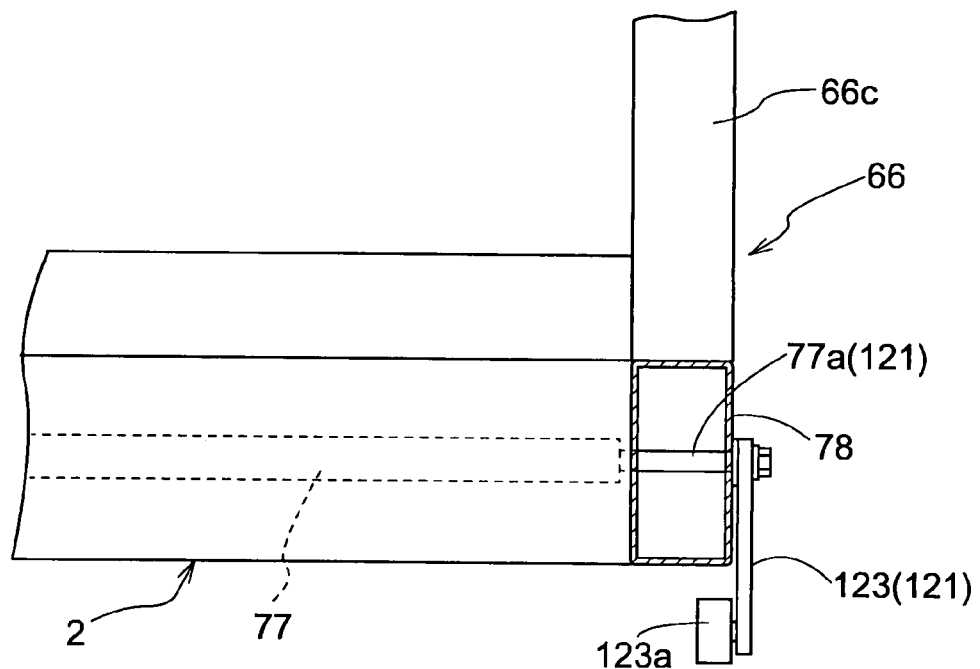
FIG. 32 is a transverse plan view illustrating the lid operating means of another embodiment.

That is, it is possible that the operation section 121 is provided such that it projects laterally from the side face portion of the container main unit 66, and the operated section 123a at the distal end thereof is provided to be located forward from the from the front face portion of the side wall 66c of the container main section 66. Specifically, for example, the following configuration is possible. As shown in FIG. 32, the operation lever 123 is linked to the end portion of the operation rotation shaft 77a that projects laterally from the side face portion of the container main unit 66, in a state in which the operation lever 123 extends to the front side from the lid forming member 77, which is in a position along the vertical direction, and the operation lever 123 is thereby provided such that the operated section 123a is located forward from the front face portion of the side wall 66c of the container main unit 66. Then, as shown in FIG. 31, the lid operation means 125 is constituted by an electric cylinder 126 provided with the moving member 126a that slides in the vertical direction, and the operation member 127 provided in an upper end portion of the moving member 126a. And as shown in FIG. 31B, the operation member 127 is moved to the upper side with the electric cylinder 126 such that the operation member 127 pushes upward the operated section 123a of the operation lever 123, thereby putting the operation lever 123 in the open position achieved by the operation lever 123 swinging to the upper side, and as shown in FIG. 31A, as a result of the operation member 127 moving to the lower side with the electric cylinder 126, the operated section 123a moves to the lower side by its own weight, thereby putting the operation lever 123 in the closed position achieved by the operation lever 123 swinging to the lower side.

Figure 33:
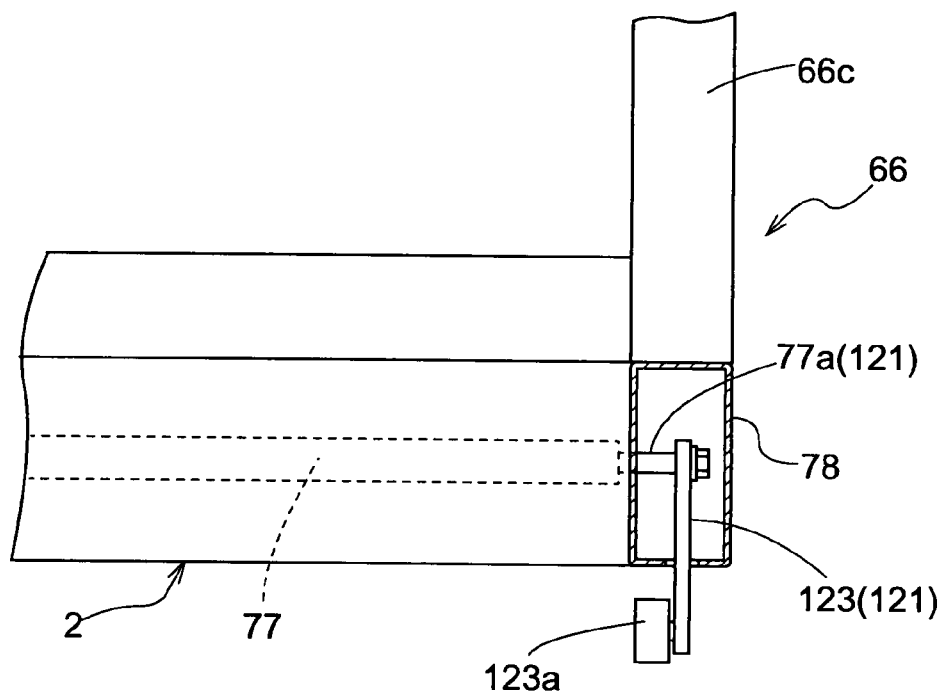
FIG. 33 is a transverse plan view illustrating the lid operating means of another embodiment.

It is also possible that the operation 121 is provided such that it projects forward from the front face portion of the side wall 66c of the container main unit 66, and the operated section 123a at the distal end thereof is provided to be located forward from the front face portion of the side wall 66c of the container main unit 66. Specifically, for example, the following configuration is possible. As shown in FIG. 33, the operation rotation shaft 77a is provided so as not to project laterally from the side face portions of the container main unit 66, the operation lever 123 is linked to the operation rotation shaft 77a in a state in which the operation lever 123 extends to the front side from the lid forming member 77, which is in a position along the vertical direction, and the operation lever 123 is thereby provided such that the operated section 123a at the distal end thereof is located forward from the front face portion of the side wall 66c of the container main unit 66. And as shown in FIG. 31B, the operation member 127 is moved to the upper side with the electric cylinder 126 so as to put the operation lever 123 in the open position achieved by the operation lever 123 swinging to the upper side and also as shown in FIG. 31A, as a result of the operation member 127 moving to the lower side with the electric cylinder 126, the operation lever 123 is put in the closed position achieved by the operation lever 123 swinging to the lower side.

In these other embodiments, as shown in FIG. 31, the operation lever 123 is L-shaped, that is, vent downward in front in the closed position, and as shown in FIGS. 32 and 33, the operation section 121 is provided such that the operated section 123a is located at the side of the ventilation opening 75 of the lid 65.

Also in the second embodiment, the lid operation means 125 is separately provided to operate the operation section 121. However, a configuration is possible in which existing devices such as the centering device 111 is used to operate the operation section 121, and the operation section 121 is operated without separately providing the lid operation means 125.

Specifically, for example, as shown in FIG. 31, a configuration is possible in which the operation section 121 that moves in a direction intersecting the front face portion of the container main unit 66 to open the lid 65 by is provided such that it projects forward from the front face portion of the side wall 66c of the container main unit 66, and then a member of the existing centering device 111 (push operation roller 116) that pushes the side face of the container 2 pushes the operation section 121 to open the lid 65, and the lid 65 opens as a result of the operation section 121 moving in the direction intersecting the face direction of the front face portion.

Also, the operation section 121 may be operated only manually by the operator. In each embodiment, when the lid 65 is mounted on the container main unit 66, the lid frame unit 78 of the lid 65 forms part of the container main unit 66, and therefore the front face portion of the side wall 66c of the container main unit 66 refers to the front face portion of the vertical frame portion of the lid frame unit 78 of the lid 65.

(17) In the first embodiment, the centering device 111 may be provided in the mount and support section 32. Also in the second embodiment, the centering device 111 may not be provided in the mount and support section 32.

What is claimed is:

1. A container configured to hold a plurality of substrates lined up vertically with space therebetween, comprising:
   a container main unit that is tubular having a generally quadrangular cross section, the container including a first opening provided on one end side and a second opening provided on the other end side spaced apart in the horizontal direction from the first opening, the first opening serving as an entrance for loading and unloading the substrates;
   a fan filter unit that is provided in an area of the second opening and that causes movement of air from the second opening toward the first opening in a direction parallel to top surfaces of the substrates when the substrates are placed in the container; and
   a lid configured to be attached in an area of the entrance of the container main unit, the lid having an open state and a closed state, and forming a plurality of ventilation openings that allow air to pass in the closed state.

2. The container of claim 1,
   wherein the plurality of ventilation openings are formed in the vertical direction in a slit shape that extends horizontally over substantially the same length as a lateral width direction of the entrance.

3. The container of claim 2,
   wherein each of the ventilation openings is formed in the vertical direction so as to correspond to a respective one of the plurality of substrates held in the container main unit.

4. The container of claim 1,
   wherein the lid comprises a plurality of lid forming members arranged in the vertical direction,
   loading and unloading of each of the plurality of substrates is allowed in the open state of the lid, and
   in the open state, the lid opens the entrance by rotating each of the plurality of lid forming members to form a plurality of substrate loading and unloading openings, and spaces between adjacent substrate loading and unloading openings are blocked.

5. The container of claim 4,
   wherein each of the lid forming members has substantially the same longitudinal width as the lateral width direction of the entrance, and plurality of ventilation openings is formed between each lid forming member and an adjacent lid forming member in the closed state; and
   each of the lid forming members rotates about an axis that extends in a lateral width direction of the entrance, and one of the plurality of substrate loading and unloading openings is formed between each lid forming member and an adjacent lid forming member in the open state.

6. The container of claim 1,
   wherein the lid is biased in a direction of the closed state; and
   an operation section that is moved upwardly to put the lid in the open state is provided such that the operation section projects downward from a bottom face portion of the container main unit.

7. The container of claim 1, further comprising:
   an operation section that is moved in a direction along a side face portion of the container main unit to put the lid in the open state,
   wherein the operation section projects laterally from the side face portion of the container main unit.

8. The container of claim 1, further comprising:
   an operation section that is moved in the vertical direction to put the lid in the open state,
   wherein an operated portion at a distal end of the operation section is positioned forward from a front face portion of a side wall of the container main unit.

9. The container of claim 1,
   wherein the lid is detachably attached to the container main unit.

10. The container of claim 1,
    wherein the fan filter unit comprises a fan, a filter and a power receiving section supported by a frame unit.

11. The container of claim 10,
    wherein the fan filter unit comprises a battery that supplies power to the fan.

12. A container configured to hold a plurality of substrates lined up vertically with space therebetween, comprising:
    a container main unit that is tubular having a generally quadrangular cross section, the container including a first opening provided on one end side and a second opening provided on the other end side spaced apart in the horizontal direction from the first opening, the first opening serving as an entrance for loading and unloading the substrates;
    a fan filter unit that is provided in an area of the second opening and that causes movement of air from the second opening toward the first opening; and
    a lid configured to be attached in an area of the entrance of the container main unit, the lid having an open state and a closed state, and forming a plurality of ventilation openings that allow air to pass in the closed state,
    wherein loading and unloading of each of the plurality of substrates is allowed in the open state of the lid, and
    the lid comprises a plurality of lid forming members arranged in the vertical direction, and
    each of the lid forming members has substantially the same longitudinal width as the lateral width direction of the entrance, and one of the plurality of ventilation openings is formed between each lid forming member and an adjacent lid forming member in the closed state, and
    each of the lid forming members rotates about an axis that extends in a lateral width direction of the entrance, and one of the plurality of substrate loading and unloading opening is formed between each lid forming member and an adjacent lid forming member in the open state.

* * * * *

UNITED STATES PATENT AND TRADEMARK OFFICE
CERTIFICATE OF CORRECTION

PATENT NO. : 7,694,817 B2 Page 1 of 1
APPLICATION NO. : 11/900657
DATED : April 13, 2010
INVENTOR(S) : Ikehata It is certified that error appears in the above-identified patent and that said Letters Patent is hereby corrected as shown below:

Column 25, Line 52, Claim 5, "and plurality of" should read -- and one of the plurality of --

Column 26, Line 57, Claim 12, "unloading opening" should read -- unloading openings --

Signed and Sealed this

Tenth Day of August, 2010

David J. Kappos
*Director of the United States Patent and Trademark Office*